US 9,269,751 B2

(12) United States Patent
Shen et al.

(10) Patent No.: US 9,269,751 B2
(45) Date of Patent: Feb. 23, 2016

(54) DISPLAY PANEL

(71) Applicant: Au Optronics Corporation, Hsinchu (TW)

(72) Inventors: Shih-Ming Shen, Tainan (TW);
Meng-Ting Lee, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/453,609

(22) Filed: Aug. 6, 2014

(65) Prior Publication Data

US 2015/0349033 A1 Dec. 3, 2015

(30) Foreign Application Priority Data

May 28, 2014 (TW) .............................. 103118662 A

(51) Int. Cl.
*H01L 29/20* (2006.01)
*H01L 27/32* (2006.01)
*H01L 51/52* (2006.01)

(52) U.S. Cl.
CPC ........ *H01L 27/3213* (2013.01); *H01L 27/3216* (2013.01); *H01L 27/3218* (2013.01); *H01L 51/5218* (2013.01); *H01L 51/5221* (2013.01); *H01L 2251/558* (2013.01)

(58) Field of Classification Search
CPC ............ H01L 27/3213; H01L 27/3216; H01L 27/3218; H01L 51/5218; H01L 51/5221; H01L 2251/558
USPC .......................................................... 257/89
See application file for complete search history.

(56) References Cited

U.S. PATENT DOCUMENTS

| 8,174,008 | B1 * | 5/2012 | Chiang et al. ................... 257/40 |
| 9,093,648 | B2 * | 7/2015 | Uchida et al. | |
| 2005/0280008 | A1 * | 12/2005 | Ricks et al. ..................... 257/79 |
| 2007/0146242 | A1 * | 6/2007 | Miller et al. .................... 345/76 |
| 2007/0159086 | A1 * | 7/2007 | Yu et al. .......................... 313/506 |
| 2009/0072693 | A1 * | 3/2009 | Cok et al. ....................... 313/110 |
| 2009/0091238 | A1 * | 4/2009 | Cok et al. ....................... 313/498 |
| 2009/0200922 | A1 * | 8/2009 | Lee et al. ....................... 313/504 |
| 2009/0294785 | A1 * | 12/2009 | Cok ................................. 257/98 |
| 2010/0052524 | A1 * | 3/2010 | Kinoshita ....................... 313/504 |
| 2010/0053038 | A1 * | 3/2010 | Sakamoto ....................... 345/76 |
| 2011/0074272 | A1 * | 3/2011 | Sakamoto et al. ............. 313/113 |
| 2011/0304263 | A1 * | 12/2011 | Xia et al. ....................... 313/504 |

(Continued)

FOREIGN PATENT DOCUMENTS

TW I328207 8/2010
TW I366419 6/2012

*Primary Examiner* — Caleb Henry
(74) *Attorney, Agent, or Firm* — Jianq Chyun IP Office

(57) ABSTRACT

A display panel is provided. The display panel includes a substrate and a plurality of sub-pixels. The substrate includes a plurality of unit regions. One first sub-pixel, one second sub-pixel, one third sub-pixel and one fourth sub-pixel are disposed in each unit region. Each sub-pixel includes a first electrode layer, a light-emitting layer and a second electrode layer. The light-emitting layer is disposed on the first electrode layer, and the second electrode layer is disposed on the light-emitting layer. The light-emitting layer of each first sub-pixel and the light-emitting layer of each second sub-pixel include a same light-emitting material capable of emitting a first color light and a second color light. A difference between a main peak of the first color light and a main peak of the second color light is within 50 nm in the wavelength range.

14 Claims, 10 Drawing Sheets

(56) References Cited

U.S. PATENT DOCUMENTS

| | | |
|---|---|---|
| 2012/0025732 A1* | 2/2012 | Hamaguchi ............... 315/250 |
| 2012/0091482 A1* | 4/2012 | Uchida et al. ............... 257/88 |
| 2012/0161171 A1* | 6/2012 | Yang et al. ................. 257/89 |
| 2012/0242723 A1* | 9/2012 | Miyake ...................... 345/694 |
| 2013/0105778 A1* | 5/2013 | Kim et al. ................... 257/40 |
| 2013/0140533 A1* | 6/2013 | Lee et al. ................... 257/40 |
| 2013/0140535 A1* | 6/2013 | Chu et al. ................... 257/40 |
| 2013/0175514 A1* | 7/2013 | Han et al. ................... 257/40 |
| 2013/0320308 A1* | 12/2013 | Lee et al. ................... 257/40 |
| 2013/0320837 A1* | 12/2013 | Weaver et al. ............. 313/504 |
| 2014/0065750 A1* | 3/2014 | Harikrishna Mohan et al. ............... 438/35 |
| 2014/0110682 A1* | 4/2014 | Shih ........................... 257/40 |
| 2014/0175404 A1* | 6/2014 | Shim .......................... 257/40 |
| 2014/0183496 A1* | 7/2014 | Heo ............................ 257/40 |
| 2014/0183499 A1* | 7/2014 | Kim et al. ................... 257/40 |
| 2014/0191202 A1* | 7/2014 | Shim et al. .................. 257/40 |
| 2014/0203244 A1* | 7/2014 | Hack et al. .................. 257/40 |
| 2014/0209888 A1* | 7/2014 | Hack et al. .................. 257/40 |
| 2014/0327709 A1* | 11/2014 | Hack et al. .................. 345/694 |
| 2014/0353626 A1* | 12/2014 | Shim et al. .................. 257/40 |
| 2015/0103338 A1* | 4/2015 | Kim et al. ................... 356/237.1 |

* cited by examiner

DISPLAY PANEL

CROSS-REFERENCE TO RELATED APPLICATION

This application claims the priority benefit of Taiwan application serial no. 103118662, filed on May 28, 2014. The entirety of the above-mentioned patent application is hereby incorporated by reference herein and made a part of this specification.

BACKGROUND

1. Technical Field

The invention relates to a display panel, and particularly relates to a display panel having a high resolution.

2. Related Art

In recent years, since organic light-emitting diode (OLED) display has advantages of self-luminous, wide viewing angle, low power consumption, simple in procedure, low cost, wide range of operating temperature, high response speed and full color, etc., it has a great potential to become a mainstream of flat panel displays of a next generation. Along with continuous progress of display technology, it becomes a basic demand for the displays to display high resolution images. However, in the current OLED displays, due to limitation of a circuit size, it is difficult to achieve high resolution. Therefore, how to achieve the high resolution of the OLED display has become a development focus.

SUMMARY

The invention is directed to a display panel, which has a high resolution and is capable of emitting four color lights.

The invention provides a display panel including a substrate, a plurality of first sub-pixels, a plurality of second sub-pixels, a plurality of third sub-pixels and a plurality of fourth sub-pixels. The substrate includes a plurality of unit regions, wherein the unit regions are arranged along a first direction and a second direction. The first sub-pixels, the second sub-pixels, the third sub-pixels and the fourth sub-pixels are disposed on the substrate, wherein each of the unit regions is configured with one first sub-pixel, one second sub-pixel, one third sub-pixel and one fourth sub-pixel. Each of the first sub-pixels, each of the second sub-pixels, each of the third sub-pixels and each of the fourth sub-pixels respectively include a first electrode layer, a light-emitting layer and a second electrode layer. The light-emitting layer is disposed on the first electrode layer, and the second electrode layer is disposed on the light-emitting layer. The light-emitting layer of each of the first sub-pixels and the light-emitting layer of each of the second sub-pixels include a same light-emitting material, wherein the light-emitting material is capable of emitting a first color light and a second color light, and a difference between a main peak of the first color light and a main peak of the second color light is within 50 nm in a wavelength range.

According to the above descriptions, in the display panel of the present invention, the same light-emitting material contained in the light-emitting layer of the first sub-pixel and contained in the light-emitting layer of the second sub-pixel is capable of emitting two color lights with a main peak difference therebetween within 50 nm. In this way, not only the display panel is capable of emitting four color lights, but also a production cost of the display panel is decreased, and a fabrication process thereof is simplified.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
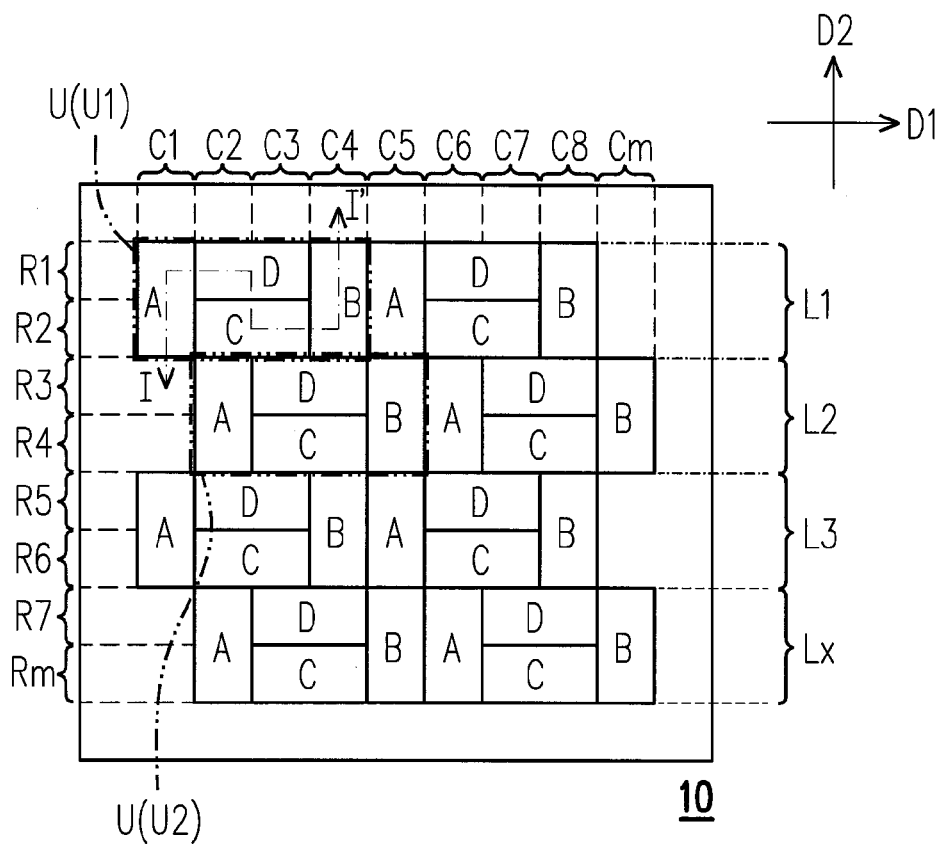
FIG. 1 is a top view of a display panel according to an embodiment of the invention.
Figure 2:
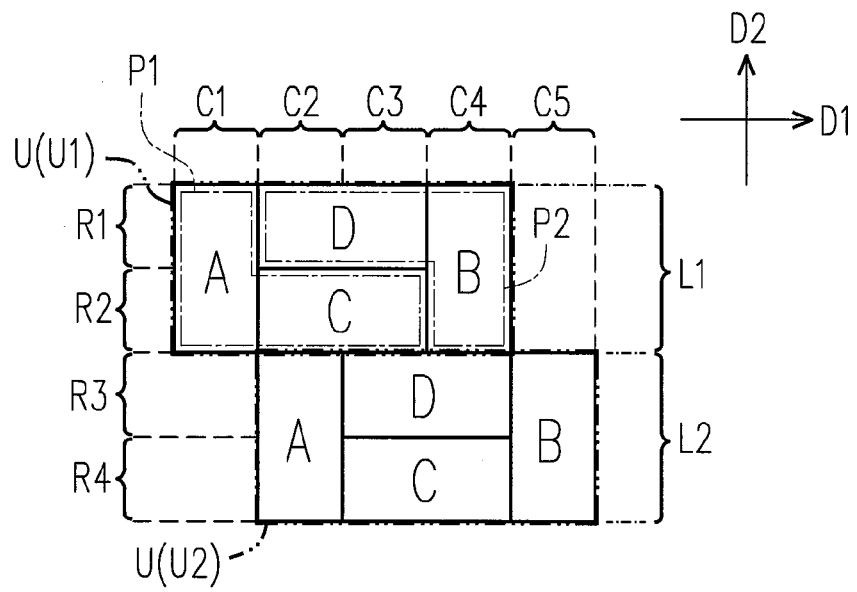
FIG. 2 is an enlarged view of unit regions U1 and U2 of FIG. 1.
Figure 3:
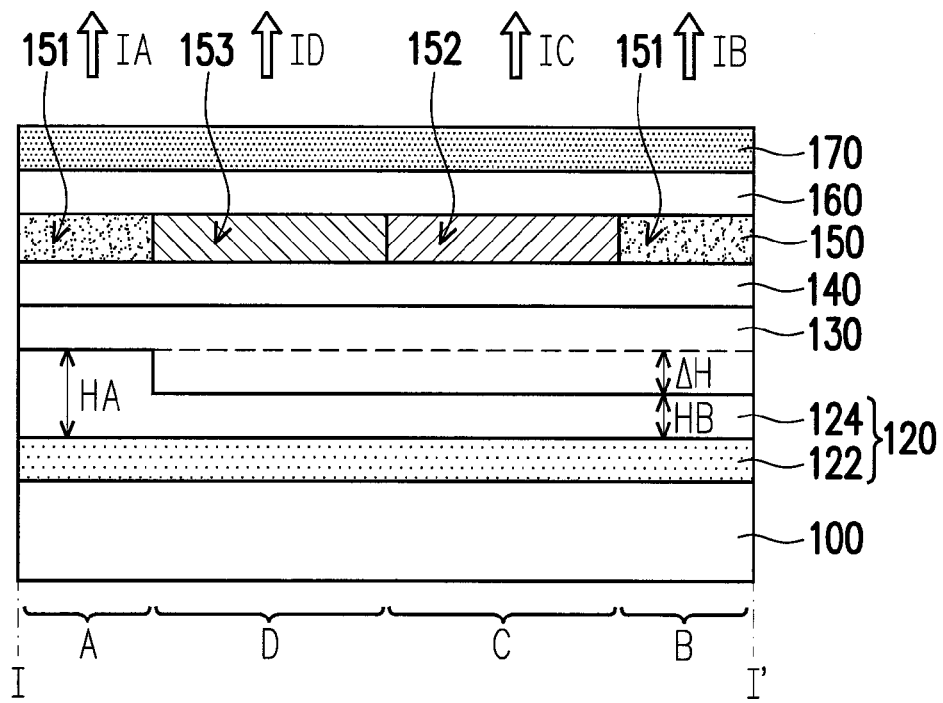
FIG. 3 is a cross-sectional view along a section line I-I' of FIG. 1.

FIG. 1 is a top view of a display panel according to an embodiment of the invention, FIG. 2 is an enlarged view of unit regions U1 and U2 of FIG. 1, and FIG. 3 is a cross-sectional view along a section line I-I' of FIG. 1.

Referring to FIG. 1 to FIG. 3, the display panel 10 is, for example, a self-luminous display panel. In the present embodiment, the display panel 10 is, for example, an organic light-emitting diode (OLED) display panel, and the display panel 10 includes a substrate 100 and a plurality of first sub-pixels A, a plurality of second sub-pixels B, a plurality of third sub-pixels C and a plurality of fourth sub-pixels D.

The substrate 100 includes a plurality of unit regions U. The unit regions U are arranged in delta arrangement along a first direction D1 and a second direction D2. In detail, the unit regions U are arranged into a plurality of unit region rows L1-Lx along the first direction D1, where the unit region row L1 and the unit region row L2 are arranged in dislocation, the unit region row L2 and the unit region row L3 are arranged in dislocation, and the unit region row L3 and the unit region row Lx are arranged in dislocation. Namely, in the present embodiment, any row of the unit region rows L1-Lx is arranged in dislocation with a next row thereof. The material of the substrate 100 is, for example, glass, quartz, organic polymer or metal, etc.

The first sub-pixels A, the second sub-pixels B, the third sub-pixels C and the fourth sub-pixels D are disposed on the substrate 100. The first sub-pixels A, the second sub-pixels B, the third sub-pixels C and the fourth sub-pixels D define a plurality of sub-columns C1-Cm and a plurality of sub-rows R1-Rn on the substrate 100. In FIG. 1, the sub-columns C1-Cm are arranged along the first direction D1 and the sub-rows R1-Rn are arranged along the second direction D2. Therefore, the sub-columns C1-Cm can be referred to as vertical sub-columns, and the sub-rows R1-Rn can be referred to as horizontal sub-rows, though the invention is not limited thereto. In another embodiment, the sub-columns C1-Cm are arranged along the second direction D2 and the sub-rows R1-Rn are arranged along the first direction D1. In this way, the display panel of the other embodiment is the display panel 10 of FIG. 1 rotated by 90 degrees.

Moreover, each of the unit region rows L1-Lx is located on two of the sub-rows R1-Rn. In detail, as shown in FIG. 1 and FIG. 2, the unit region row L1 is located on the sub-row R1 and the sub-row R2, the unit region row L2 is located on the sub-row R3 and the sub-row R4, the unit region row L3 is located on the sub-row R5 and the sub-row R6, and the unit region row Lx is located on the sub-row R7 and the sub-row Rm.

In the following descriptions, design and arrangement of the first sub-pixels A, the second sub-pixels B, the third sub-pixels C and the fourth sub-pixels D are described in detail.

In the present embodiment, each of the unit regions U is configured with one first sub-pixel A, one second sub-pixel B, one third sub-pixel C and one fourth sub-pixel D. In detail, as shown in FIG. 1 and FIG. 2, the first sub-pixels A, the second sub-pixels B, the third sub-pixels C and the fourth sub-pixels D are all rectangles and respectively have two long sides and two short sides, where the extending directions of the two long sides of the first sub-pixels A and the second sub-pixels B are parallel to the second direction D2, the extending directions of the two long sides of the third sub-pixels C and the fourth sub-pixels D are parallel to the second direction D1, and the third sub-pixels C and the fourth sub-pixels D are located between the first sub-pixels A and the second sub-pixels B and are arranged along the second direction D2.

Moreover, as shown in FIG. 2, in the present embodiment, the first sub-pixel A and the third sub-pixel C in each of the unit regions U construct a first pixel P1, and the second sub-pixel B and the fourth sub-pixel D in each of the unit regions U construct a second pixel P2, and the first pixel P1 and the second pixel P2 respectively have an L-shape. Namely, in the present embodiment, each of the first pixels P1 and each of the second pixels P2 are respectively composed of two sub-pixels, such that compared to the conventional display panel in which pixels are composed of three sub-pixels, the area of the first pixel P1 and the second pixel P2 of the display panel 10 is reduced, so as to enhance the resolution.

According to the above descriptions, in the present embodiment, as shown in FIG. 1 and FIG. 2, in the unit region U1 of the unit region row L1, the first sub-pixel A is located on a first sub-column (i.e. the sub-column C1) and is located on a first sub-row and a second sub-row (i.e. the sub-row R1 and the sub-row R2), the third sub-pixel C is located on a second sub-column and a third sub-column (i.e. the sub-column C2 and the sub-column C3) and is located on the second sub-row (i.e. the sub-row R2), the second sub-pixel B is located on a fourth sub-column (i.e. the sub-column C4) and is located on the first sub-row and the second sub-row (i.e. the sub-row R1 and the sub-row R2), and the fourth sub-pixel D is located on the second sub-column and the third sub-column (i.e. the sub-column C2 and the sub-column C3) and is located on the first sub-row (i.e. the sub-row R1).

Moreover, in the unit region U2 of the unit region row L2, the first sub-pixel A is located on the first sub-column (i.e. the sub-column C2) and is located on the first sub-row and the second sub-row (i.e. the sub-row R3 and the sub-row R4), the third sub-pixel C is located on the second sub-column and the third sub-column (i.e. the sub-column C3 and the sub-column C4) and is located on the second sub-row (i.e. the sub-row R4), the second sub-pixel B is located on the fourth sub-column (i.e. the sub-column C5) and is located on the first sub-row and the second sub-row (i.e. the sub-row R3 and the sub-row R4), and the fourth sub-pixel D is located on the second sub-column and the third sub-column (i.e. the sub-column C3 and the sub-column C4) and is located on the first sub-row (i.e. the sub-row R3).

In other words, in the present embodiment, the first sub-pixel A in the unit region U1 and the first sub-pixel A in the unit region U2 are located on different sub-columns. In detail, the first sub-pixel A in the unit region U1 and the first sub-pixel A in the unit region U2 are located on adjacent sub-columns. Moreover, according to another aspect, the first sub-column of the unit region U2 is aligned to the second sub-column of the unit region U1.

Moreover, according to the above descriptions, the first sub-pixels A, the second sub-pixels B, the third sub-pixels C and the fourth sub-pixels D are respectively sub-pixel structures of the OLED display panel, and each of the first sub-pixels A, each of the second sub-pixels B, each of the third sub-pixels C and each of the fourth sub-pixels D respectively include a first electrode layer 120, a hole injection layer 130, a hole transport layer 140, a light-emitting layer 150, an electron injection layer 160 and a second electrode layer 170, as shown in FIG. 1 and FIG. 3.

The first electrode layer 120 is disposed on the substrate 100. In the present embodiment, the first electrode layer 120 includes a reflective conductor layer 122 and a transparent conductive layer 124 disposed on the reflective conductor layer 122. In detail, the thickness HA of the transparent conductive layer 124 of the first sub-pixel A is greater than the thickness HB of the transparent conductive layer 124 of the second sub-pixel B, and the thickness difference ΔH between the transparent conductive layer 124 of the first sub-pixel A and the transparent conductive layer 124 of the second sub-pixel B is between 20 nm and 50 nm. In an embodiment, the thickness difference ΔH between the transparent conductive layer 124 of the first sub-pixel A and the transparent conductive layer 124 of the second sub-pixel B is preferably between 25 nm and 35 nm. Moreover, the material of the reflective conductor layer 122 is, for example, metal, metal oxide, etc., and the material of the transparent conductive layer 124 is, for example, indium tin oxide, indium zinc oxide, aluminium tin oxide, aluminium zinc oxide, indium germanium zinc oxide, or other suitable oxides.

The hole injection layer 130 and the hole transport layer 140 are sequentially disposed on the first electrode layer 120. The light-emitting layer 150 is disposed on the hole transport layer 140. In detail, the light-emitting layer 150 of the first sub-pixel A and the light-emitting layer 150 of the second sub-pixel B include a same light-emitting material 151, the light-emitting layer 150 of the third sub-pixel C includes a light-emitting material 152, and the light-emitting layer 150 of the fourth sub-pixel D includes a light-emitting material 153. Moreover, the light-emitting layer 150 is, for example, formed through an evaporation process in collaboration with a fine metal mask (FFM).

The electron injection layer 160 is disposed on the light-emitting layer 150. The second electrode layer 170 is disposed on the electron injection layer 160. The material of the second electrode layer 170 includes a transparent metal oxide conductive material such as indium tin oxide, indium zinc oxide, aluminium tin oxide, aluminium zinc oxide, indium germanium zinc oxide, or other suitable oxides, or a stacked layer of at least two of the above materials, though the invention is not limited thereto. Moreover, a polarizer or a cover plate, etc. can be formed on the second electrode layer 170 according to an actual requirement, which is not limited by the invention.

It should be noticed that in the present embodiment, micro cavities can be respectively formed between the first electrode layer 120 and the second electrode layer 170 of the first sub-pixel A, between the first electrode layer 120 and the second electrode layer 170 of the second sub-pixel B, between the first electrode layer 120 and the second electrode layer 170 of the third sub-pixel C, and between the first electrode layer 120 and the second electrode layer 170 of the fourth sub-pixel D, such that the lights respectively emitted by the light-emitting material 151, the light-emitting material 152 and the light-emitting material 153 may have a micro cavity effect when passing through the corresponding micro cavity, and the first sub-pixels A, the second sub-pixels B, the third sub-pixels C and the fourth sub-pixels D respectively emit a first color light IA, a second color light IB, a third color light IC and a fourth color light ID, where the difference between the main peak of the first color light IA and the main peak of the second color light IB is within 50 nm in a wavelength range.

In other words, in the present embodiment, the light-emitting materials 151 contained in the light-emitting layer 150 of the first sub-pixel A and the light-emitting layer 150 of the second sub-pixel B is capable of emitting two color lights (i.e. the first color light IA and the second color light IB), where the difference between the main peaks of the two color lights is within 50 nm, and the reason thereof is as follows. According to the above descriptions, in the present embodiment, the thickness HA of the transparent conductive layer 124 of the first sub-pixel A is greater than the thickness HB of the transparent conductive layer 124 of the second sub-pixel B, and the thickness difference ΔH there between is from 20 nm to 50 nm, such that a length of the micro cavity of the first sub-pixel A and a length of the micro cavity of the second sub-pixel B are different, which may result in a fact that the light emitted by the light-emitting material 151 may have a wavelength shift phenomenon after passing through the micro cavity of the second sub-pixel B to produce the micro cavity effect thereon. In this way, in the present embodiment, by using the same light-emitting material 151 in the light-emitting layer 150 of the first sub-pixel A and in the light-emitting layer 150 of the second sub-pixel B, and making the thickness difference ΔH between the transparent conductive layer 124 of the first sub-pixel A and the transparent conductive layer 124 of the second sub-pixel B to be between 20 nm and 50 nm, not only the display panel 10 can emit four color lights (i.e. the first color light IA, the second color light IB, the third color light IC and the fourth color light ID), but also the number of times of using the fine metal mask during fabrication of the light-emitting layer 150 is decreased, so as to decrease a production cost of the display panel 10 and simplify a fabrication process thereof.

Further, in an example, the light-emitting material 151 is a yellow light-emitting material, the light-emitting material 152 is a blue light-emitting material, and the light-emitting material 153 is a red light-emitting material. The first color light IA is a yellow light (with a main peak of 560 nm), the second color light IB is a green light (with a main peak of 530 nm), the third color light IC is a blue light (with a main peak of 460 nm), and the fourth color light ID is a red light (with a main peak of 620 nm). Namely, in the present example, the first sub-pixel A, the second sub-pixel B, the third sub-pixel C and the fourth sub-pixel D are respectively yellow sub-pixel, green sub-pixel, blue sub-pixel and red sub-pixel, though the invention is not limited thereto. In other examples, a color combination of the first sub-pixel A, the second sub-pixel B, the third sub-pixel C and the fourth sub-pixel D can be other suitable combinations. For example, when the light-emitting material 151 is the yellow light-emitting material, the first color light IA is the green light, and the second color light IB is the yellow light (i.e. the first sub-pixel A is the green sub-pixel, and the second sub-pixel B is the yellow sub-pixel). In detail, in the aforementioned case, the thickness HB of the transparent conductive layer 124 of the second sub-pixel B is greater than the thickness HA of the transparent conductive layer 124 of the first sub-pixel A, and the thickness difference ΔH there between is from 20 nm to 50 nm.

It should be noticed that in the present embodiment, the display panel 10 is a RGBY four-color display panel, and compared to the conventional RGB three-color display panel, as the yellow sub-pixels are added, the average power consumption of the RGBY four-color display panel is decreased and a color saturation NTSC is enhanced.

In another example, the light-emitting material 151 is the red light-emitting material, the light-emitting material 152 is the blue light-emitting material, and the light-emitting material 153 is the green light-emitting material. The first color light IA is the red light (with the main peak of 620 nm), the second color light IB is an orange light (with a main peak of 590 nm), the third color light IC is the blue light (with the main peak of 460 nm), and the fourth color light ID is the green light (with the main peak of 530 nm). Namely, in the present example, the first sub-pixel A, the second sub-pixel B, the third sub-pixel C and the fourth sub-pixel D are respectively red sub-pixel, orange sub-pixel, blue sub-pixel and green sub-pixel, though the invention is not limited thereto. In other examples, a color combination of the first sub-pixel A, the second sub-pixel B, the third sub-pixel C and the fourth sub-pixel D can be other suitable combinations. For example, when the light-emitting material 151 is the red light-emitting material, the first color light IA is an orange light, and the second color light IB is the red light (i.e. the first sub-pixel A is the orange sub-pixel, and the second sub-pixel B is the red sub-pixel). In detail, in the aforementioned case, the thickness HB of the transparent conductive layer 124 of the second sub-pixel B is greater than the thickness HA of the transparent conductive layer 124 of the first sub-pixel A, and the thickness difference ΔH there between is from 20 nm to 50 nm.

In still another example, the light-emitting material 151 is the green light-emitting material, the light-emitting material 152 is the blue light-emitting material, and the light-emitting material 153 is the red light-emitting material. The first color light IA is the green light (with the main peak of 530 nm), the second color light IB is a cyan light (with a main peak of 490 nm), the third color light IC is the blue light (with the main peak of 460 nm), and the fourth color light ID is the red light (with the main peak of 620 nm). Namely, in the present example, the first sub-pixel A, the second sub-pixel B, the third sub-pixel C and the fourth sub-pixel D are respectively green sub-pixel, cyan sub-pixel, blue sub-pixel and red sub-pixel, though the invention is not limited thereto. In other examples, a color combination of the first sub-pixel A, the second sub-pixel B, the third sub-pixel C and the fourth sub-pixel D can be other suitable combinations. For example, when the light-emitting material 151 is the green light-emitting material, the first color light IA is a cyan light, and the second color light IB is the green light (i.e. the first sub-pixel A is the cyan sub-pixel, and the second sub-pixel B is the green sub-pixel). In detail, in the aforementioned case, the thickness HB of the transparent conductive layer 124 of the second sub-pixel B is greater than the thickness HA of the transparent conductive layer 124 of the first sub-pixel A, and the thickness difference ΔH there between is from 20 nm to 50 nm.

Moreover, design and arrangement of the sub-pixels in the display panel of the invention are not limited to the aforementioned embodiment. Display panels of other embodiments are described below with reference of FIG. 4 to FIG. 17. It should be noticed that in the following descriptions, differences of the embodiments are mainly described, and the parts with the same technical contents are not repeated.

Figure 4:
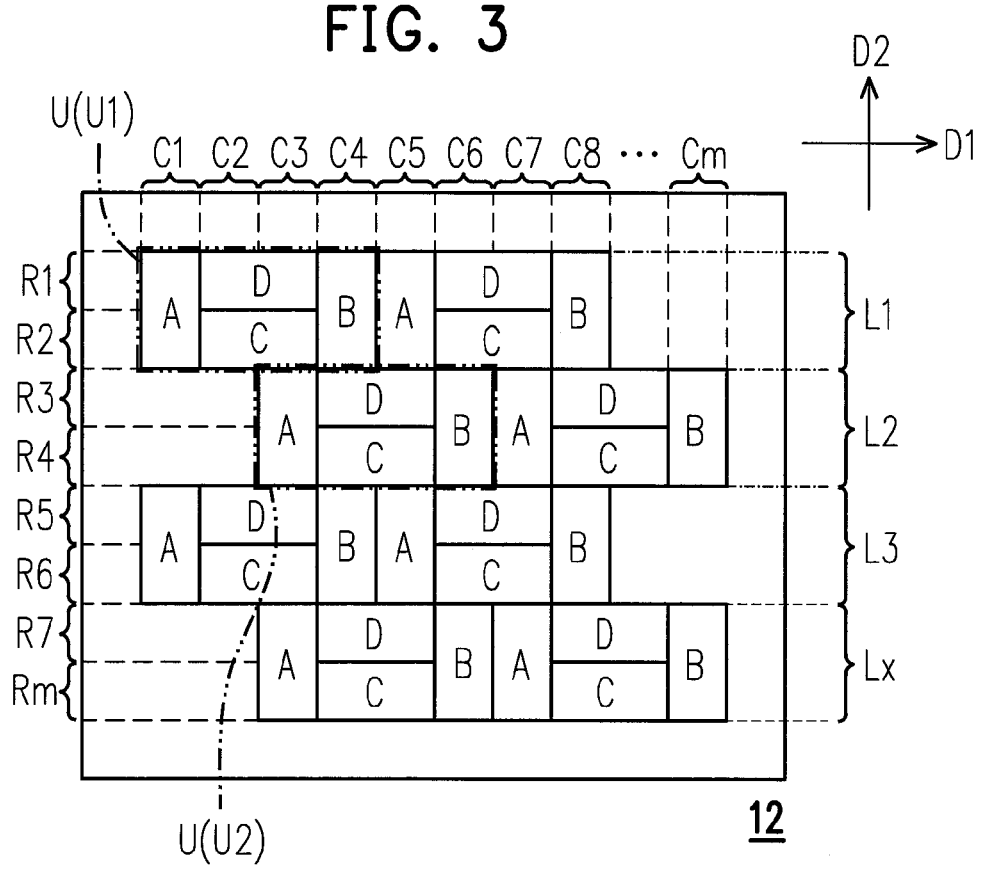
FIG. 4-FIG. 19 are top views of display panels according to other embodiments of the invention.

FIG. 4 is a top view of a display panel according to another embodiment of the invention. Referring to FIG. 4 and FIG. 1, the display panel 12 of FIG. 4 is similar to the display panel 10 of FIG. 1, so that the same components are denoted by the same referential numbers, and details thereof are not repeated. Differences between the display panel 12 of FIG. 4 and the display panel 10 of FIG. 1 are as follows. In the display panel 12 of FIG. 4, in the unit region U2 of the unit region row L2, the first sub-pixel A is located on the first sub-column (i.e. the sub-column C3) and is located on the first sub-row and the second sub-row (i.e. the sub-row R3 and the sub-row R4), the third sub-pixel C is located on the second sub-column and the third sub-column (i.e. the sub-column C4 and the sub-column C5) and is located on the second sub-row (i.e. the sub-row R4), the second sub-pixel B is located on the fourth sub-column (i.e. the sub-column C6) and is located on the first sub-row and the second sub-row (i.e. the sub-row R3 and the sub-row R4), and the fourth sub-pixel D is located on the second sub-column and the third sub-column (i.e. the sub-column C4 and the sub-column C5) and is located on the first sub-row (i.e. the sub-row R3).

In other words, in the embodiment of FIG. 4, the first sub-pixel A in the unit region U1 and the first sub-pixel A in the unit region U2 are located on different sub-columns. Further, the first sub-pixel A in the unit region U1 and the first sub-pixel A in the unit region U2 are spaced by one sub-column from each other. Moreover, in view of another aspect, the first sub-column of the unit region U2 is aligned to the third sub-column of the unit region U1.

Figure 5:
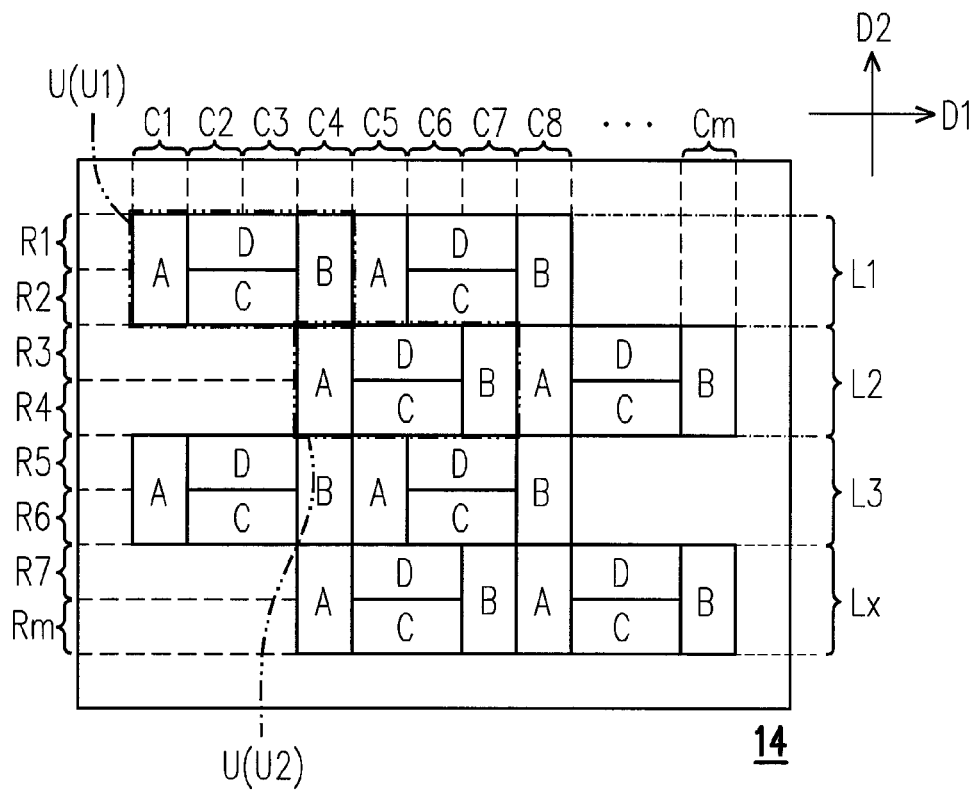

FIG. 5 is a top view of a display panel according to another embodiment of the invention. Referring to FIG. 5 and FIG. 1, the display panel 14 of FIG. 5 is similar to the display panel 10 of FIG. 1, so that the same components are denoted by the same referential numbers, and details thereof are not repeated. Differences between the display panel 14 of FIG. 5 and the display panel 10 of FIG. 1 are as follows. In the display panel 14 of FIG. 5, in the unit region U2 of the unit region row L2, the first sub-pixel A is located on the first sub-column (i.e. the sub-column C4) and is located on the first sub-row and the second sub-row (i.e. the sub-row R3 and the sub-row R4), the third sub-pixel C is located on the second sub-column and the third sub-column (i.e. the sub-column C5 and the sub-column C6) and is located on the second sub-row (i.e. the sub-row R4), the second sub-pixel B is located on the fourth sub-column (i.e. the sub-column C7) and is located on the first sub-row and the second sub-row (i.e. the sub-row R3 and the sub-row R4), and the fourth sub-pixel D is located on the second sub-column and the third sub-column (i.e. the sub-column C5 and the sub-column C6) and is located on the first sub-row (i.e. the sub-row R3).

In other words, in the embodiment of FIG. 5, the first sub-pixel A in the unit region U1 and the first sub-pixel A in the unit region U2 are located on different sub-columns. Further, the first sub-pixel A in the unit region U1 and the first sub-pixel A in the unit region U2 are spaced by two sub-columns from each other. Moreover, in view of another aspect, the first sub-column of the unit region U2 is aligned to the fourth sub-column of the unit region U1.

Figure 6:
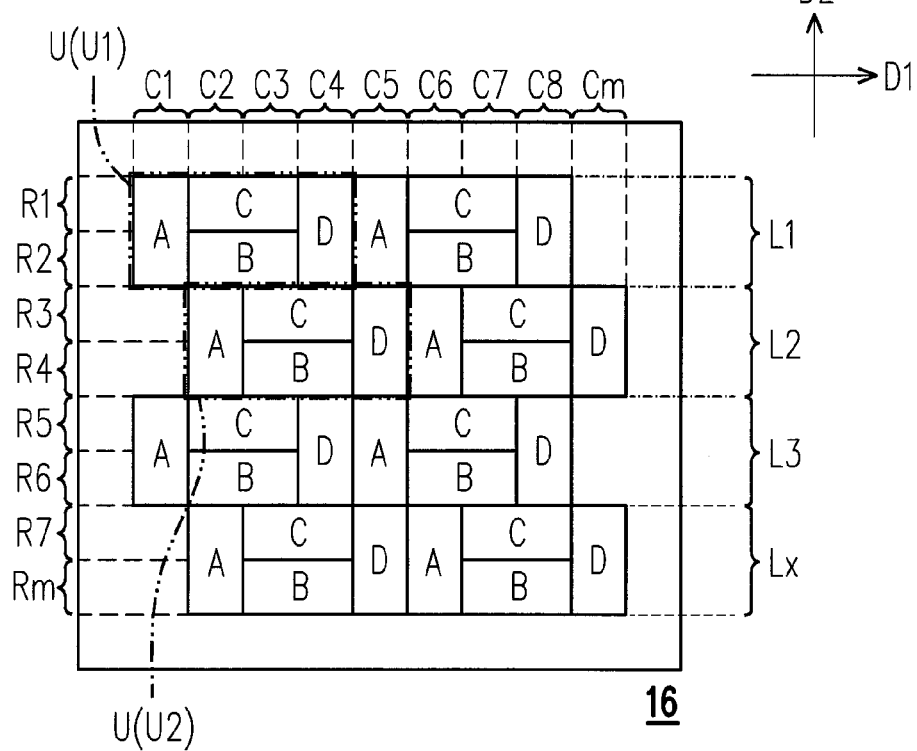

FIG. 6 is a top view of a display panel according to another embodiment of the invention. Referring to FIG. 6 and FIG. 1, the display panel 16 of FIG. 6 is similar to the display panel 10 of FIG. 1, so that the same components are denoted by the same referential numbers, and details thereof are not repeated. Differences between the display panel 16 of FIG. 6 and the display panel 10 of FIG. 1 are as follows. In the display panel 16 of FIG. 6, in the unit region U1 of the unit region row L1, the first sub-pixel A is located on the first sub-column (i.e. the sub-column C1) and is located on the first sub-row and the second sub-row (i.e. the sub-row R1 and the sub-row R2), the second sub-pixel B is located on the second sub-column and the third sub-column (i.e. the sub-column C2 and the sub-column C3) and is located on the second sub-row (i.e. the sub-row R2), the fourth sub-pixel D is located on the fourth sub-column (i.e. the sub-column C4) and is located on the first sub-row and the second sub-row (i.e. the sub-row R1 and the sub-row R2), and the third sub-pixel C is located on the second sub-column and the third sub-column (i.e. the sub-column C2 and the sub-column C3) and is located on the first sub-row (i.e. the sub-row R1). And in the unit region U2 of the unit region row L2, the first sub-pixel A is located on the first sub-column (i.e. the sub-column C2) and is located on the first sub-row and the second sub-row (i.e. the sub-row R3 and the sub-row R4), the second sub-pixel B is located on the second sub-column and the third sub-column (i.e. the sub-column C3 and the sub-column C4) and is located on the second sub-row (i.e. the sub-row R4), the fourth sub-pixel D is located on the fourth sub-column (i.e. the sub-column C5) and is located on the first sub-row and the second sub-row (i.e. the sub-row R3 and the sub-row R4), and the third sub-pixel C is located on the second sub-column and the third sub-column (i.e. the sub-column C3 and the sub-column C4) and is located on the first sub-row (i.e. the sub-row R3).

In other words, in the embodiment of FIG. 6, the first sub-pixel A in the unit region U1 and the first sub-pixel A in the unit region U2 are located on different sub-columns. Further, the first sub-pixel A in the unit region U1 and the first sub-pixel A in the unit region U2 are located on the adjacent sub-columns. Moreover, in view of another aspect, the first sub-column of the unit region U2 is aligned to the second sub-column of the unit region U1.

Moreover, referring to FIG. 2, FIG. 3 and FIG. 6, in the present embodiment, the first sub-pixel A and the second sub-pixel B using the same light-emitting material 151 and capable of emitting two color lights (i.e. the first color light IA and the second color light IB) with the main peak difference therebetween within 50 nm are respectively located on the first sub-column and located on the first sub-row and the second sub-row, and located on the second sub-column and the third sub-column and located on the second sub-row. Namely, in the present embodiment, the extending direction of two long sides of the first sub-pixel A is parallel to the second direction D2, and the extending direction of two long sides of the second sub-pixel B is parallel to the first direction D1, and the first sub-pixel A and the second sub-pixel B construct a pixel (i.e. the first pixel P1).

Figure 7:
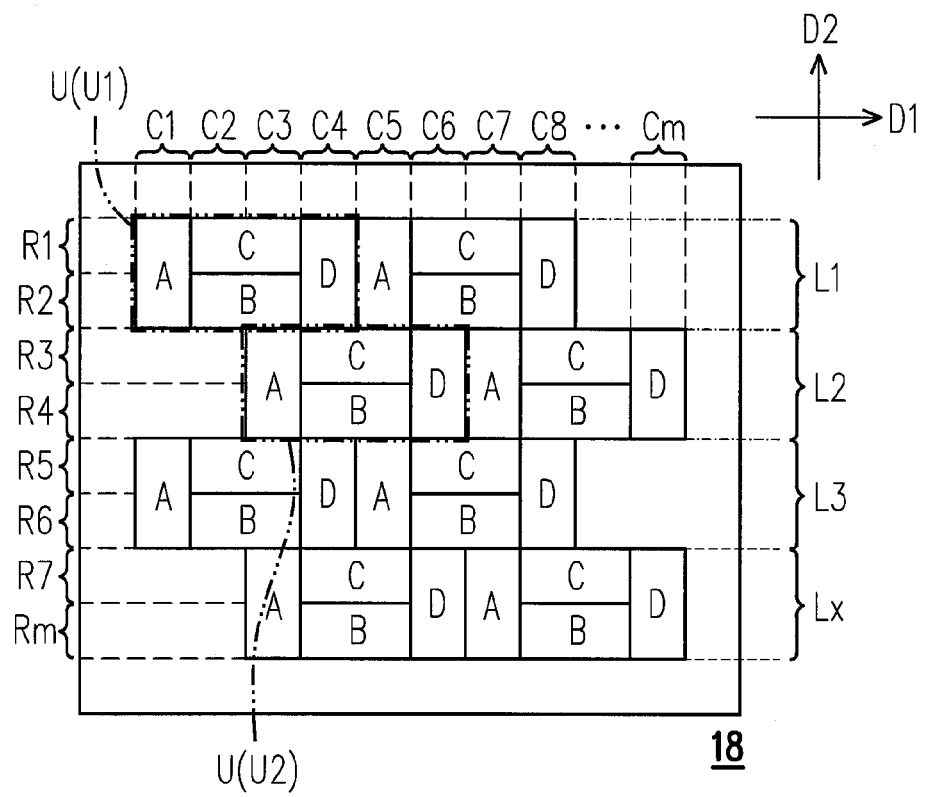

FIG. 7 is a top view of a display panel according to another embodiment of the invention. Referring to FIG. 7 and FIG. 6, the display panel 18 of FIG. 7 is similar to the display panel 16 of FIG. 6, so that the same components are denoted by the same referential numbers, and details thereof are not repeated. Differences between the display panel 18 of FIG. 7 and the display panel 16 of FIG. 6 are as follows. In the display panel 18, in the unit region U2 of the unit region row L2, the first sub-pixel A is located on the first sub-column (i.e. the sub-column C3) and is located on the first sub-row and the second sub-row (i.e. the sub-row R3 and the sub-row R4), the second sub-pixel B is located on the second sub-column and the third sub-column (i.e. the sub-column C4 and the sub-column C5) and is located on the second sub-row (i.e. the sub-row R4), the fourth sub-pixel D is located on the fourth sub-column (i.e. the sub-column C6) and is located on the first sub-row and the second sub-row (i.e. the sub-row R3 and the sub-row R4), and the third sub-pixel C is located on the second sub-column and the third sub-column (i.e. the sub-column C4 and the sub-column C5) and is located on the first sub-row (i.e. the sub-row R3).

In other words, in the embodiment of FIG. 7, the first sub-pixel A in the unit region U1 and the first sub-pixel A in the unit region U2 are located on different sub-columns. Further, the first sub-pixel A in the unit region U1 and the first sub-pixel A in the unit region U2 are spaced by one sub-column. Moreover, in view of another aspect, the first sub-column of the unit region U2 is aligned to the third sub-column of the unit region U1.

Figure 8:
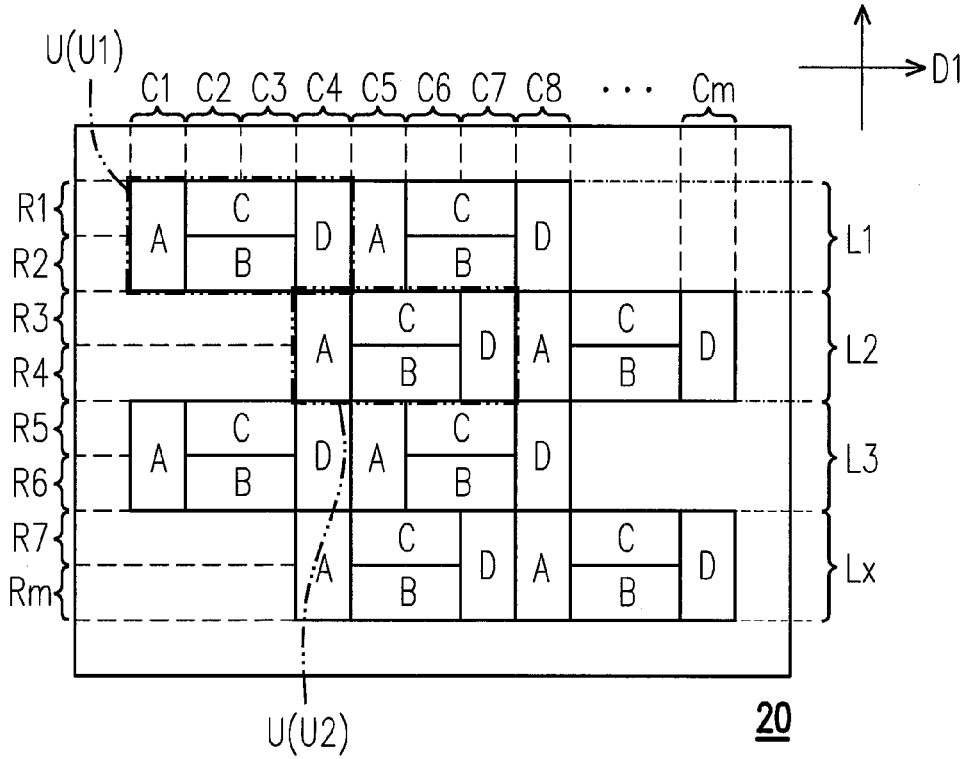

FIG. 8 is a top view of a display panel according to another embodiment of the invention. Referring to FIG. 8 and FIG. 6, the display panel 20 of FIG. 8 is similar to the display panel 16 of FIG. 6, so that the same components are denoted by the same referential numbers, and details thereof are not repeated. Differences between the display panel 20 of FIG. 8 and the display panel 16 of FIG. 6 are as follows. In the display panel 20 of FIG. 8, in the unit region U2 of the unit region row L2, the first sub-pixel A is located on the first sub-column (i.e. the sub-column C4) and is located on the first sub-row and the second sub-row (i.e. the sub-row R3 and the sub-row R4), the second sub-pixel B is located on the second sub-column and the third sub-column (i.e. the sub-column C5 and the sub-column C6) and is located on the second sub-row (i.e. the sub-row R4), the fourth sub-pixel D is located on the fourth sub-column (i.e. the sub-column C7) and is located on the first sub-row and the second sub-row (i.e. the sub-row R3 and the sub-row R4), and the third sub-pixel C is located on the second sub-column and the third sub-column (i.e. the sub-column C5 and the sub-column C6) and is located on the first sub-row (i.e. the sub-row R3).

In other words, in the embodiment of FIG. 8, the first sub-pixel A in the unit region U1 and the first sub-pixel A in the unit region U2 are located on different sub-columns. Further, the first sub-pixel A in the unit region U1 and the first sub-pixel A in the unit region U2 are spaced by two sub-columns. Moreover, in view of another aspect, the first sub-column of the unit region U2 is aligned to the fourth sub-column of the unit region U1.

Figure 9:
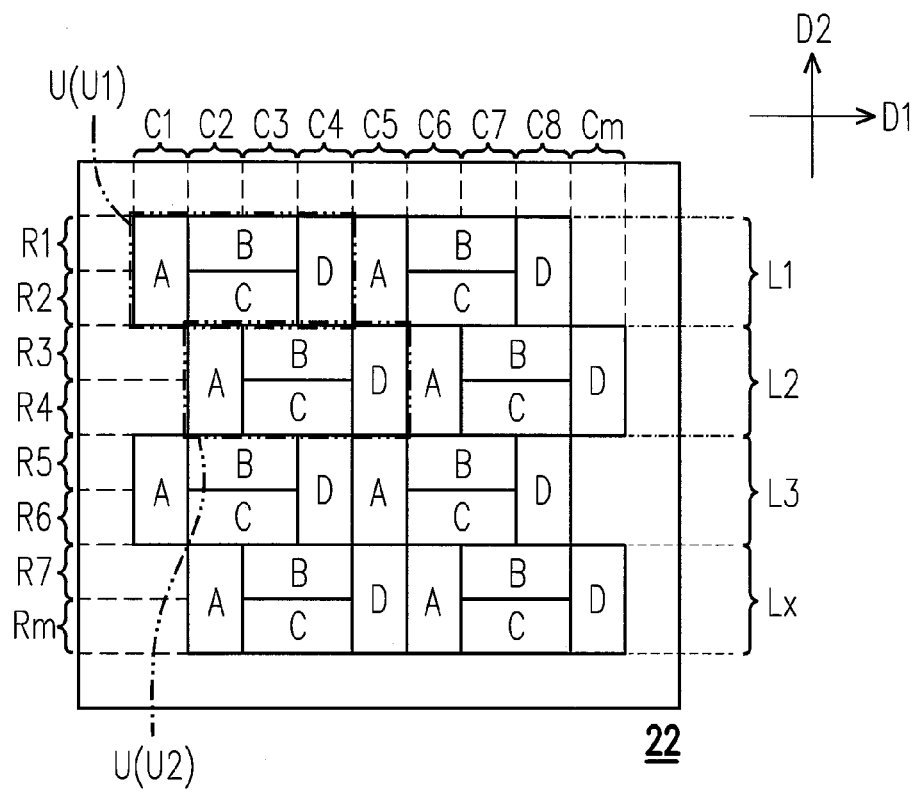

FIG. 9 is a top view of a display panel according to another embodiment of the invention. Referring to FIG. 9 and FIG. 1, the display panel 22 of FIG. 9 is similar to the display panel 10 of FIG. 1, so that the same components are denoted by the same referential numbers, and details thereof are not repeated. Differences between the display panel 22 of FIG. 9 and the display panel 10 of FIG. 1 are as follows. In the display panel 22 of FIG. 9, in the unit region U1 of the unit region row L1, the first sub-pixel A is located on the first sub-column (i.e. the sub-column C1) and is located on the first sub-row and the second sub-row (i.e. the sub-row R1 and the sub-row R2), the third sub-pixel C is located on the second sub-column and the third sub-column (i.e. the sub-column C2 and the sub-column C3) and is located on the second sub-row (i.e. the sub-row R2), the fourth sub-pixel D is located on the fourth sub-column (i.e. the sub-column C4) and is located on the first sub-row and the second sub-row (i.e. the sub-row R1 and the sub-row R2), and the second sub-pixel B is located on the second sub-column and the third sub-column (i.e. the sub-column C2 and the sub-column C3) and is located on the first sub-row (i.e. the sub-row R1). And in the unit region U2 of the unit region row L2, the first sub-pixel A is located on the first sub-column (i.e. the sub-column C2) and is located on the first sub-row and the second sub-row (i.e. the sub-row R3 and the sub-row R4), the third sub-pixel C is located on the second sub-column and the third sub-column (i.e. the sub-column C3 and the sub-column C4) and is located on the second sub-row (i.e. the sub-row R4), the fourth sub-pixel D is located on the fourth sub-column (i.e. the sub-column C5) and is located on the first sub-row and the second sub-row (i.e. the sub-row R3 and the sub-row R4), and the second sub-pixel B is located on the second sub-column and the third sub-column (i.e. the sub-column C3 and the sub-column C4) and is located on the first sub-row (i.e. the sub-row R3).

In other words, in the embodiment of FIG. 9, the first sub-pixel A in the unit region U1 and the first sub-pixel A in the unit region U2 are located on different sub-columns. Further, the first sub-pixel A in the unit region U1 and the first sub-pixel A in the unit region U2 are located on adjacent sub-columns. Moreover, in view of another aspect, the first sub-column of the unit region U2 is aligned to the second sub-column of the unit region U1.

Moreover, referring to FIG. 3 and FIG. 9, in the present embodiment, the first sub-pixel A and the second sub-pixel B using the same light-emitting material 151 and capable of emitting two color lights (i.e. the first color light IA and the second color light IB) with the main peak difference therebetween within 50 nm are respectively located on the first sub-column and located on the first sub-row and the second sub-row, and located on the second sub-column and the third sub-column and located on the first sub-row. Namely, in the present embodiment, the extending direction of two long sides of the first sub-pixel A is parallel to the second direction D2, and the extending direction of two long sides of the second sub-pixel B is parallel to the first direction D1, and the first sub-pixel A and the third sub-pixel C construct a pixel (i.e. the first pixel P1), and the fourth sub-pixel D and the second sub-pixel B construct a pixel (i.e. the second pixel P2).

Figure 10:
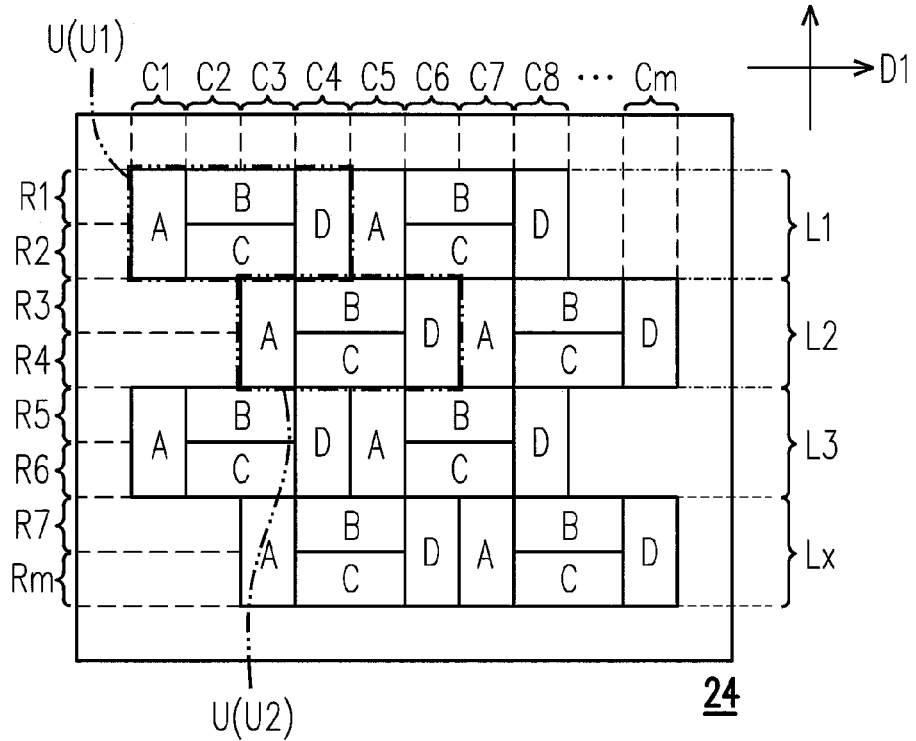

FIG. 10 is a top view of a display panel according to another embodiment of the invention. Referring to FIG. 10 and FIG. 9, the display panel 24 of FIG. 10 is similar to the display panel 22 of FIG. 9, so that the same components are denoted by the same referential numbers, and details thereof are not repeated. Differences between the display panel 24 of FIG. 10 and the display panel 22 of FIG. 9 are as follows. In the display panel 24 of FIG. 10, in the unit region U2 of the unit region row L2, the first sub-pixel A is located on the first sub-column (i.e. the sub-column C3) and is located on the first sub-row and the second sub-row (i.e. the sub-row R3 and the sub-row R4), the third sub-pixel C is located on the second sub-column and the third sub-column (i.e. the sub-column C4 and the sub-column C5) and is located on the second sub-row (i.e. the sub-row R4), the fourth sub-pixel D is located on the fourth sub-column (i.e. the sub-column C6) and is located on the first sub-row and the second sub-row (i.e. the sub-row R3 and the sub-row R4), and the second sub-pixel B is located on the second sub-column and the third sub-column (i.e. the sub-column C4 and the sub-column C5) and is located on the first sub-row (i.e. the sub-row R3).

In other words, in the embodiment of FIG. 10, the first sub-pixel A in the unit region U1 and the first sub-pixel A in the unit region U2 are located on different sub-columns. Further, the first sub-pixel A in the unit region U1 and the first sub-pixel A in the unit region U2 are spaced by one sub-column. Moreover, in view of another aspect, the first sub-column of the unit region U2 is aligned to the third sub-column of the unit region U1.

Figure 11:
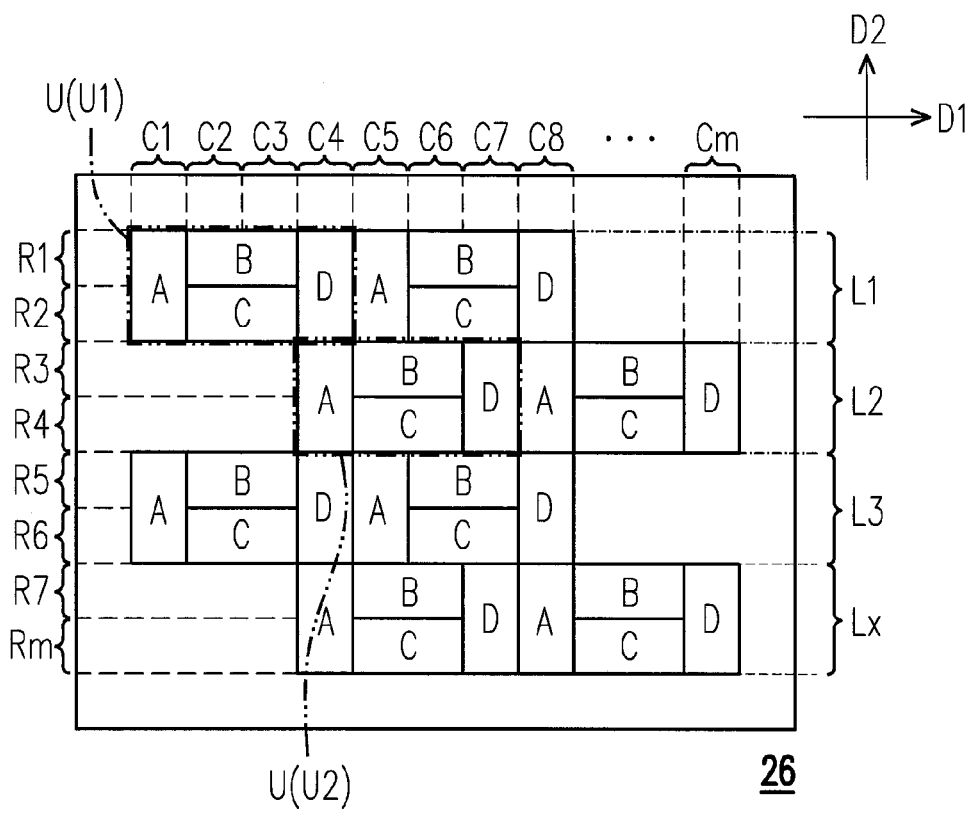

FIG. 11 is a top view of a display panel according to another embodiment of the invention. Referring to FIG. 11 and FIG. 9, the display panel 26 of FIG. 11 is similar to the display panel 22 of FIG. 9, so that the same components are denoted by the same referential numbers, and details thereof are not repeated. Differences between the display panel 26 of FIG. 11 and the display panel 22 of FIG. 9 are as follows. In the display panel 26 of FIG. 11, in the unit region U2 of the unit region row L2, the first sub-pixel A is located on the first sub-column (i.e. the sub-column C4) and is located on the first sub-row and the second sub-row (i.e. the sub-row R3 and the sub-row R4), the third sub-pixel C is located on the second sub-column and the third sub-column (i.e. the sub-column C5 and the sub-column C6) and is located on the second sub-row (i.e. the sub-row R4), the fourth sub-pixel D is located on the fourth sub-column (i.e. the sub-column C7) and is located on the first sub-row and the second sub-row (i.e. the sub-row R3 and the sub-row R4), and the second sub-pixel B is located on the second sub-column and the third sub-column (i.e. the sub-column C5 and the sub-column C6) and is located on the first sub-row (i.e. the sub-row R3).

In other words, in the embodiment of FIG. 11, the first sub-pixel A in the unit region U1 and the first sub-pixel A in the unit region U2 are located on different sub-columns. Further, the first sub-pixel A in the unit region U1 and the first sub-pixel A in the unit region U2 are spaced by two sub-columns. Moreover, in view of another aspect, the first sub-column of the unit region U2 is aligned to the fourth sub-column of the unit region U1.

Figure 12:
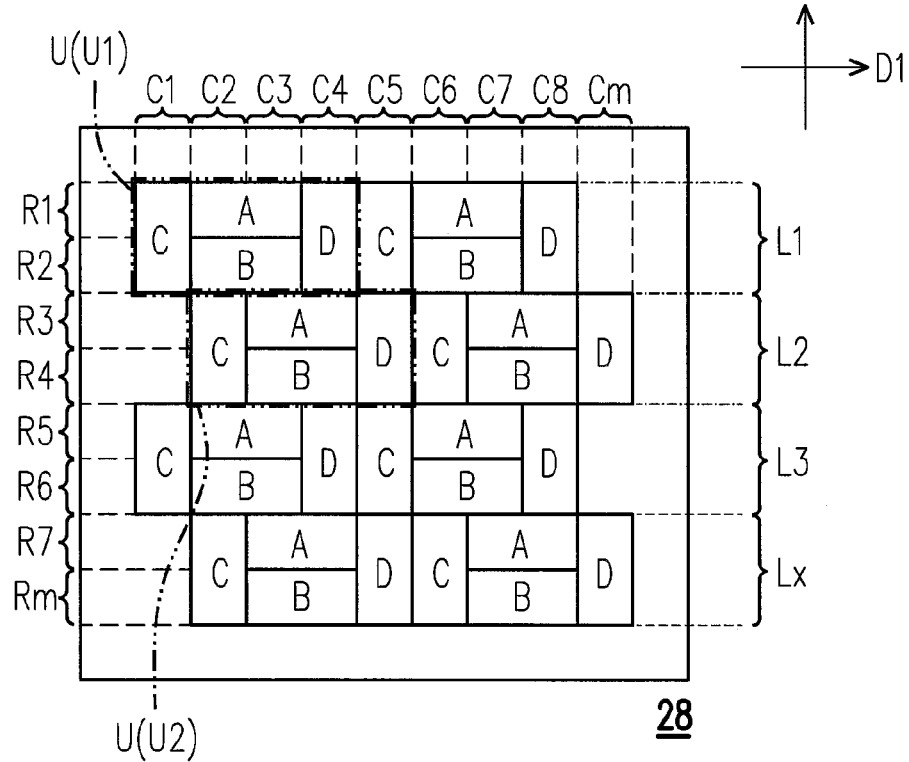

FIG. 12 is a top view of a display panel according to another embodiment of the invention. Referring to FIG. 12 and FIG. 1, the display panel 28 of FIG. 12 is similar to the display panel 10 of FIG. 1, so that the same components are denoted by the same referential numbers, and details thereof are not repeated. Differences between the display panel 28 of FIG. 12 and the display panel 10 of FIG. 1 are as follows. In the display panel 28 of FIG. 12, in the unit region U1 of the unit region row L1, the third sub-pixel C is located on the first sub-column (i.e. the sub-column C1) and is located on the first sub-row and the second sub-row (i.e. the sub-row R1 and the sub-row R2), the second sub-pixel B is located on the second sub-column and the third sub-column (i.e. the sub-column C2 and the sub-column C3) and is located on the second sub-row (i.e. the sub-row R2), the fourth sub-pixel D is located on the fourth sub-column (i.e. the sub-column C4) and is located on the first sub-row and the second sub-row (i.e. the sub-row R1 and the sub-row R2), and the first sub-pixel A is located on the second sub-column and the third sub-column (i.e. the sub-column C2 and the sub-column C3) and is located on the first sub-row (i.e. the sub-row R1). And in the unit region U2 of the unit region row L2, the third sub-pixel C is located on the first sub-column (i.e. the sub-column C2) and is located on the first sub-row and the second sub-row (i.e. the sub-row R3 and the sub-row R4), the second sub-pixel B is located on the second sub-column and the third sub-column (i.e. the sub-column C3 and the sub-column C4) and is located on the second sub-row (i.e. the sub-row R4), the fourth sub-pixel D is located on the fourth sub-column (i.e. the sub-column C5) and is located on the first sub-row and the second sub-row (i.e. the sub-row R3 and the sub-row R4), and the first sub-pixel A is located on the second sub-column and the third sub-column (i.e. the sub-column C3 and the sub-column C4) and is located on the first sub-row (i.e. the sub-row R3).

In other words, in the embodiment of FIG. 12, the extending directions of two long sides of the third sub-pixel C and the fourth sub-pixel D are parallel to the second direction D2, and the extending directions of two long sides of the first sub-pixel A and the second sub-pixel B are parallel to the first direction D1, and the first sub-pixel A and the second sub-pixel B are located between the third sub-pixel C and the fourth sub-pixel D and are arranged along the second direction D2.

According to another aspect, referring to FIG. 3 and FIG. 12, in the present embodiment, the extending directions of the two long sides of the first sub-pixel A and the second sub-pixel B using the same light-emitting material 151 and capable of emitting two color lights (i.e. the first color light IA and the second color light IB) with the main peak difference therebetween within 50 nm are all parallel to the first direction D1. And the first sub-pixel A and the second sub-pixel B respectively belong to different pixels, where the third sub-pixel C and the second sub-pixel B construct a pixel (i.e. the first pixel P1), and the fourth sub-pixel D and the first sub-pixel A construct a pixel (i.e. the second pixel P2).

Figure 13:
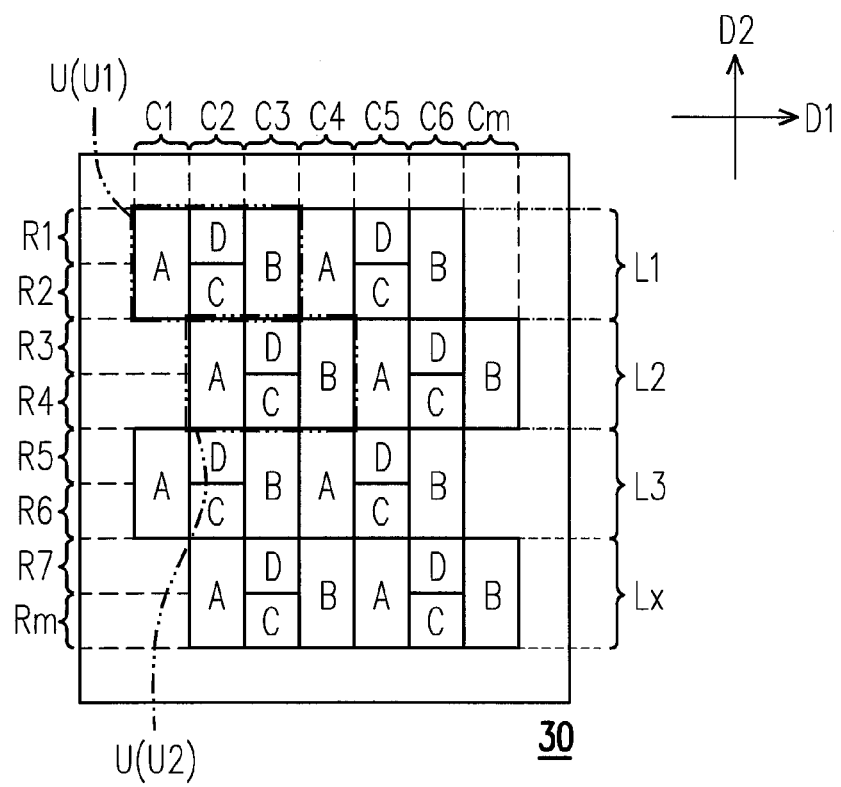

FIG. 13 is a top view of a display panel according to another embodiment of the invention. Referring to FIG. 13 and FIG. 1, the display panel 30 of FIG. 13 is similar to the display panel 10 of FIG. 1, so that the same components are denoted by the same referential numbers, and details thereof are not repeated. Differences between the display panel 30 of FIG. 13 and the display panel 10 of FIG. 1 are as follows. In the display panel 30 of FIG. 13, the shapes of the first sub-pixel A and the second sub-pixel B are rectangles, and the shapes of the third sub-pixel C and the fourth sub-pixel D are squares; and in the display panel 10 of FIG. 1, the shapes of the first sub-pixel A, the second sub-pixel B, the third sub-pixel C and the fourth sub-pixel D are all rectangles.

In detail, in the display panel 30 of FIG. 13, in the unit region U1 of the unit region row L1, the first sub-pixel A is located on the first sub-column (i.e. the sub-column C1) and is located on the first sub-row and the second sub-row (i.e. the sub-row R1 and the sub-row R2), the third sub-pixel C is located on the second sub-column (i.e. the sub-column C2) and is located on the second sub-row (i.e. the sub-row R2), the second sub-pixel B is located on the third sub-column (i.e. the sub-column C3) and is located on the first sub-row and the second sub-row (i.e. the sub-row R1 and the sub-row R2), and the fourth sub-pixel D is located on the second sub-column (i.e. the sub-column C2) and is located on the first sub-row (i.e. the sub-row R1). And in the unit region U2 of the unit region row L2, the first sub-pixel A is located on the first sub-column (i.e. the sub-column C2) and is located on the first sub-row and the second sub-row (i.e. the sub-row R3 and the sub-row R4), the third sub-pixel C is located on the second sub-column (i.e. the sub-column C3) and is located on the second sub-row (i.e. the sub-row R4), the second sub-pixel B is located on the third sub-column (i.e. the sub-column C4) and is located on the first sub-row and the second sub-row (i.e. the sub-row R3 and the sub-row R4), and the fourth sub-pixel D is located on the second sub-column (i.e. the sub-column C3) and is located on the first sub-row (i.e. the sub-row R3).

In other words, in the embodiment of FIG. 13, the first sub-pixel A in the unit region U1 and the first sub-pixel A in the unit region U2 are located on different sub-columns. Further, the first sub-pixel A in the unit region U1 and the first sub-pixel A in the unit region U2 are located on adjacent sub-columns. Moreover, in view of another aspect, the first sub-column of the unit region U2 is aligned to the second sub-column of the unit region U1.

Moreover, referring to FIG. 3 and FIG. 13, in the present embodiment, the first sub-pixel A and the second sub-pixel B using the same light-emitting material 151 and capable of emitting two color lights (i.e. the first color light IA and the second color light IB) with the main peak difference therebetween within 50 nm are respectively located on the first sub-column and located on the first sub-row and the second sub-row, and located on the third sub-column and located on the first sub-row and the second sub-row. Namely, in the present embodiment, the shapes of the first sub-pixel A and the second sub-pixel B are all rectangles, and the first sub-pixel A and the second sub-pixel B respectively belong to different pixels.

Figure 14:
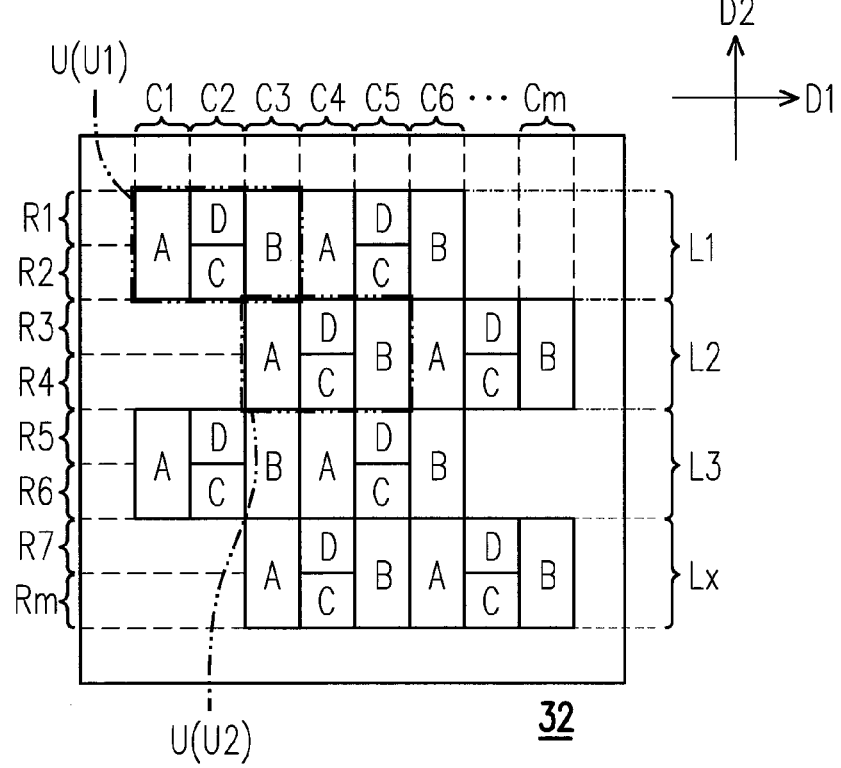

FIG. 14 is a top view of a display panel according to another embodiment of the invention. Referring to FIG. 14 and FIG. 13, the display panel 32 of FIG. 14 is similar to the display panel 30 of FIG. 13, so that the same components are denoted by the same referential numbers, and details thereof are not repeated. Differences between the display panel 32 of FIG. 14 and the display panel 30 of FIG. 13 are as follows. In the display panel 32 of FIG. 14, in the unit region U2 of the unit region row L2, the first sub-pixel A is located on the first sub-column (i.e. the sub-column C3) and is located on the first sub-row and the second sub-row (i.e. the sub-row R3 and the sub-row R4), the third sub-pixel C is located on the second sub-column (i.e. the sub-column C4) and is located on the second sub-row (i.e. the sub-row R4), the second sub-pixel B is located on the third sub-column (i.e. the sub-column C5) and is located on the first sub-row and the second sub-row (i.e. the sub-row R3 and the sub-row R4), and the fourth sub-pixel D is located on the second sub-column (i.e. the sub-column C4) and is located on the first sub-row (i.e. the sub-row R3).

In other words, in the embodiment of FIG. 14, the first sub-pixel A in the unit region U1 and the first sub-pixel A in the unit region U2 are located on different sub-columns. Further, the first sub-pixel A in the unit region U1 and the first sub-pixel A in the unit region U2 are spaced by one sub-column. Moreover, in view of another aspect, the first sub-column of the unit region U2 is aligned to the third sub-column of the unit region U1.

Figure 15:
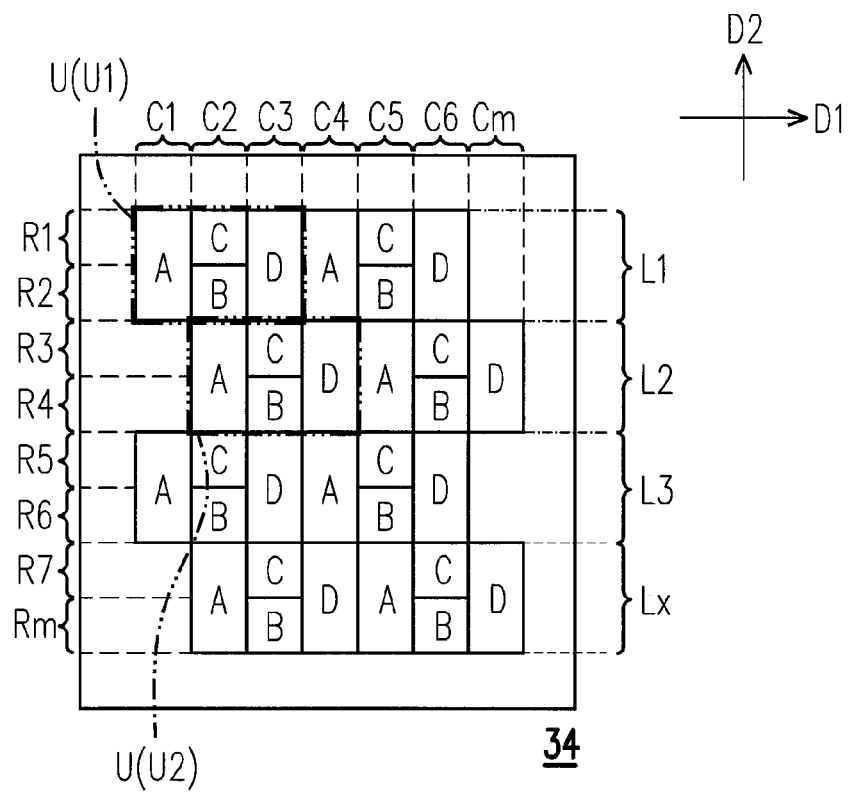

FIG. 15 is a top view of a display panel according to another embodiment of the invention. Referring to FIG. 15 and FIG. 13, the display panel 34 of FIG. 15 is similar to the display panel 30 of FIG. 13, so that the same components are denoted by the same referential numbers, and details thereof are not repeated. Differences between the display panel 34 of FIG. 15 and the display panel 30 of FIG. 13 are as follows. In the display panel 34 of FIG. 15, in the unit region U1 of the unit region row L1, the first sub-pixel A is located on the first sub-column (i.e. the sub-column C1) and is located on the first sub-row and the second sub-row (i.e. the sub-row R1 and the sub-row R2), the second sub-pixel B is located on the second sub-column (i.e. the sub-column C2) and is located on the second sub-row (i.e. the sub-row R2), the fourth sub-pixel D is located on the third sub-column (i.e. the sub-column C3) and is located on the first sub-row and the second sub-row (i.e. the sub-row R1 and the sub-row R2), and the third sub-pixel C is located on the second sub-column (i.e. the sub-column C2) and is located on the first sub-row (i.e. the sub-row R1). And in the unit region U2 of the unit region row L2, the first sub-pixel A is located on the first sub-column (i.e. the sub-column C2) and is located on the first sub-row and the second sub-row (i.e. the sub-row R3 and the sub-row R4), the second sub-pixel B is located on the second sub-column (i.e. the sub-column C3) and is located on the second sub-row (i.e. the sub-row R4), the fourth sub-pixel D is located on the third sub-column (i.e. the sub-column C4) and is located on the first sub-row and the second sub-row (i.e. the sub-row R3 and the sub-row R4), and the third sub-pixel C is located on the second sub-column (i.e. the sub-column C3) and is located on the first sub-row (i.e. the sub-row R3).

In other words, in the embodiment of FIG. 15, the first sub-pixel A in the unit region U1 and the first sub-pixel A in the unit region U2 are located on different sub-columns. Further, the first sub-pixel A in the unit region U1 and the first sub-pixel A in the unit region U2 are located on adjacent sub-columns. Moreover, in view of another aspect, the first sub-column of the unit region U2 is aligned to the second sub-column of the unit region U1.

Moreover, referring to FIG. 3 and FIG. 15, in the present embodiment, the first sub-pixel A and the second sub-pixel B using the same light-emitting material 151 and capable of emitting two color lights (i.e. the first color light IA and the second color light IB) with the main peak difference therebetween within 50 nm are respectively located on the first sub-column and located on the first sub-row and the second sub-row, and located on the second sub-column and located on the second sub-row. Namely, in the present embodiment, the shape of the first sub-pixel A is rectangle, the shape of the second sub-pixel B is square, and the first sub-pixel A and the second sub-pixel B construct a pixel (i.e. the first pixel P1).

Figure 16:
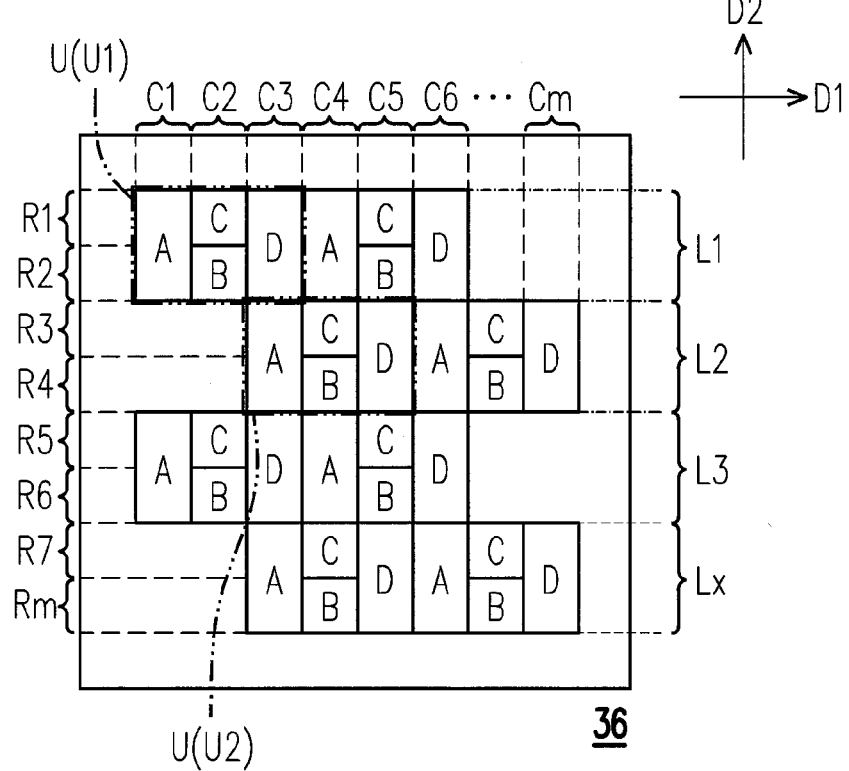

FIG. 16 is a top view of a display panel according to another embodiment of the invention. Referring to FIG. 16 and FIG. 15, the display panel 36 of FIG. 16 is similar to the display panel 34 of FIG. 15, so that the same components are denoted by the same referential numbers, and details thereof are not repeated. Differences between the display panel 36 of FIG. 16 and the display panel 34 of FIG. 15 are as follows. In the display panel 36 of FIG. 16, in the unit region U2 of the unit region row L2, the first sub-pixel A is located on the first sub-column (i.e. the sub-column C3) and is located on the first sub-row and the second sub-row (i.e. the sub-row R3 and the sub-row R4), the second sub-pixel B is located on the second sub-column (i.e. the sub-column C4) and is located on the second sub-row (i.e. the sub-row R4), the fourth sub-pixel D is located on the third sub-column (i.e. the sub-column C5) and is located on the first sub-row and the second sub-row (i.e. the sub-row R3 and the sub-row R4), and the third sub-pixel C is located on the second sub-column (i.e. the sub-column C4) and is located on the first sub-row (i.e. the sub-row R3).

In other words, in the embodiment of FIG. 16, the first sub-pixel A in the unit region U1 and the first sub-pixel A in the unit region U2 are located on different sub-columns. Further, the first sub-pixel A in the unit region U1 and the first sub-pixel A in the unit region U2 are spaced by one sub-column. Moreover, in view of another aspect, the first sub-column of the unit region U2 is aligned to the third sub-column of the unit region U1.

Figure 17:
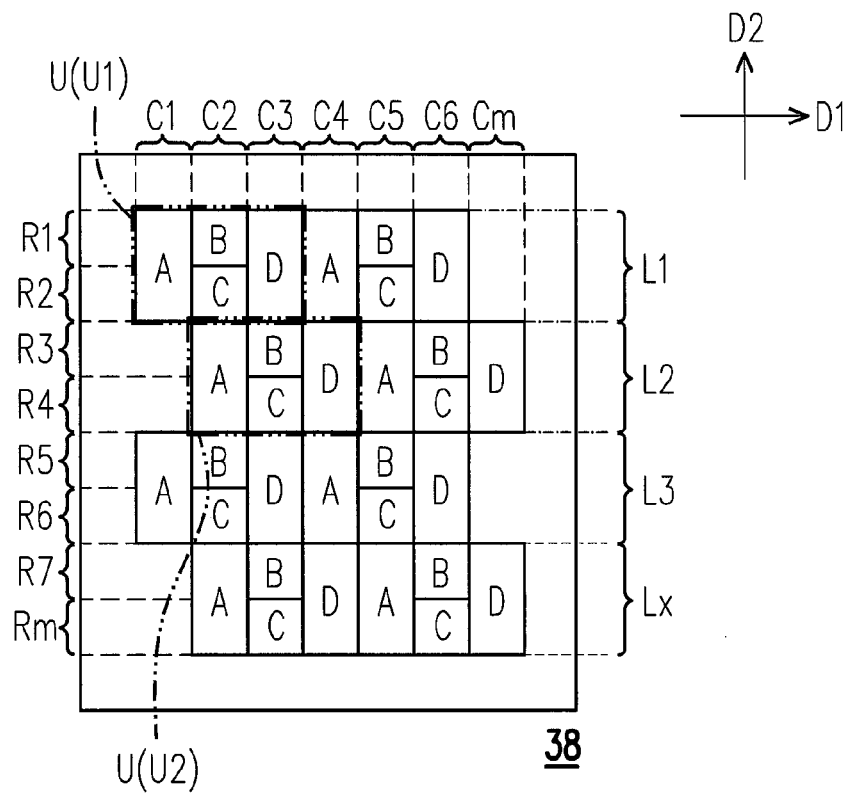

FIG. 17 is a top view of a display panel according to another embodiment of the invention. Referring to FIG. 17 and FIG. 13, the display panel 38 of FIG. 17 is similar to the display panel 30 of FIG. 13, so that the same components are denoted by the same referential numbers, and details thereof are not repeated. Differences between the display panel 38 of FIG. 17 and the display panel 30 of FIG. 13 are as follows. In the display panel 38 of FIG. 17, in the unit region U1 of the unit region row L1, the first sub-pixel A is located on the first sub-column (i.e. the sub-column C1) and is located on the first sub-row and the second sub-row (i.e. the sub-row R1 and the sub-row R2), the third sub-pixel C is located on the second sub-column (i.e. the sub-column C2) and is located on the second sub-row (i.e. the sub-row R2), the fourth sub-pixel D is located on the third sub-column (i.e. the sub-column C3) and is located on the first sub-row and the second sub-row (i.e. the sub-row R1 and the sub-row R2), and the second sub-pixel B is located on the second sub-column (i.e. the sub-column C2) and is located on the first sub-row (i.e. the sub-row R1). And in the unit region U2 of the unit region row L2, the first sub-pixel A is located on the first sub-column (i.e. the sub-column C2) and is located on the first sub-row and the second sub-row (i.e. the sub-row R3 and the sub-row R4), the third sub-pixel C is located on the second sub-column (i.e. the sub-column C3) and is located on the second sub-row (i.e. the sub-row R4), the fourth sub-pixel D is located on the third sub-column (i.e. the sub-column C4) and is located on the first sub-row and the second sub-row (i.e. the sub-row R3 and the sub-row R4), and the second sub-pixel B is located on the second sub-column (i.e. the sub-column C3) and is located on the first sub-row (i.e. the sub-row R3).

In other words, in the embodiment of FIG. 17, the first sub-pixel A in the unit region U1 and the first sub-pixel A in the unit region U2 are located on different sub-columns. Further, the first sub-pixel A in the unit region U1 and the first sub-pixel A in the unit region U2 are located on adjacent sub-columns. Moreover, in view of another aspect, the first sub-column of the unit region U2 is aligned to the second sub-column of the unit region U1.

Moreover, referring to FIG. 3 and FIG. 17, in the present embodiment, the first sub-pixel A and the second sub-pixel B using the same light-emitting material 151 and capable of emitting two color lights (i.e. the first color light IA and the second color light IB) with the main peak difference therebetween within 50 nm are respectively located on the first sub-column and located on the first sub-row and the second sub-row, and located on the second sub-column and located on the first sub-row. Namely, in the present embodiment, the shape of the first sub-pixel A is rectangle, the shape of the second sub-pixel B is square, and the first sub-pixel A and the second sub-pixel B respectively belong to different pixels.

Figure 18:
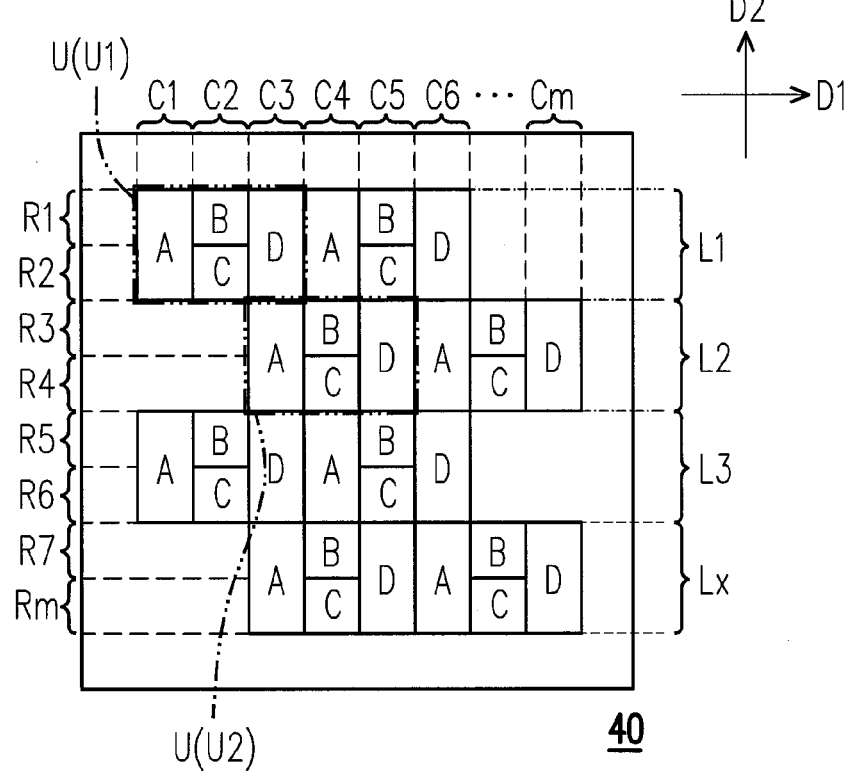

FIG. 18 is a top view of a display panel according to another embodiment of the invention. Referring to FIG. 18 and FIG. 17, the display panel 40 of FIG. 18 is similar to the display panel 38 of FIG. 17, so that the same components are denoted by the same referential numbers, and details thereof are not repeated. Differences between the display panel 40 of FIG. 18 and the display panel 38 of FIG. 17 are as follows. In the display panel 40 of FIG. 18, in the unit region U2 of the unit region row L2, the first sub-pixel A is located on the first sub-column (i.e. the sub-column C3) and is located on the first sub-row and the second sub-row (i.e. the sub-row R3 and the sub-row R4), the third sub-pixel C is located on the second sub-column (i.e. the sub-column C4) and is located on the second sub-row (i.e. the sub-row R4), the fourth sub-pixel D is located on the third sub-column (i.e. the sub-column C5) and is located on the first sub-row and the second sub-row (i.e. the sub-row R3 and the sub-row R4), and the second sub-pixel B is located on the second sub-column (i.e. the sub-column C4) and is located on the first sub-row (i.e. the sub-row R3).

In other words, in the embodiment of FIG. 18, the first sub-pixel A in the unit region U1 and the first sub-pixel A in the unit region U2 are located on different sub-columns. Further, the first sub-pixel A in the unit region U1 and the first sub-pixel A in the unit region U2 are spaced by one sub-column. Moreover, in view of another aspect, the first sub-column of the unit region U2 is aligned to the third sub-column of the unit region U1.

Figure 19:
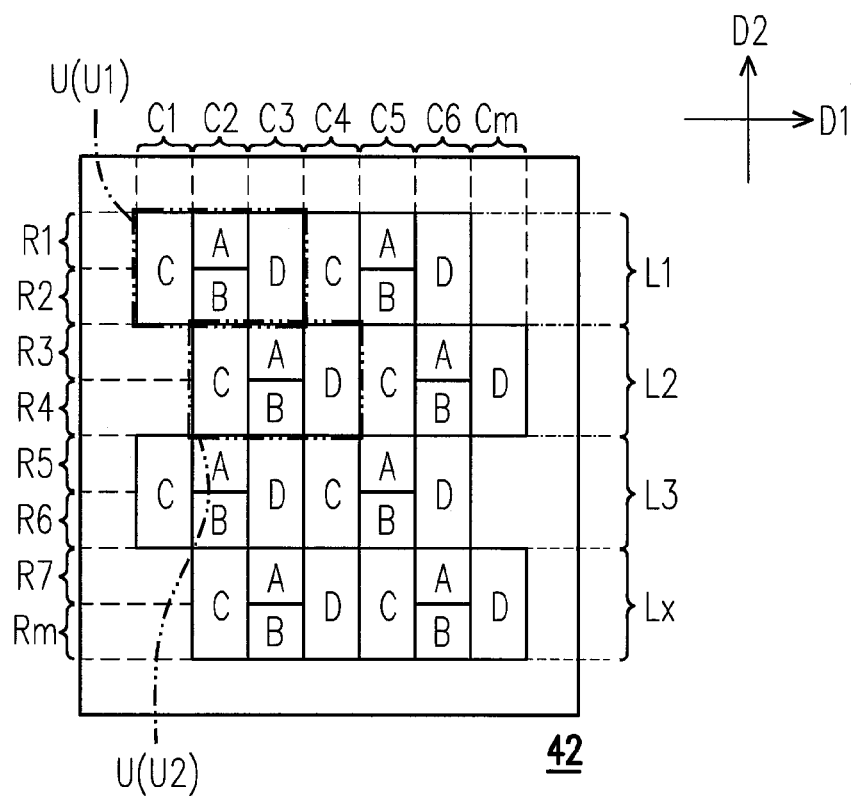

FIG. 19 is a top view of a display panel according to another embodiment of the invention. Referring to FIG. 19 and FIG. 13, the display panel 42 of FIG. 19 is similar to the display panel 30 of FIG. 13, so that the same components are denoted by the same referential numbers, and details thereof are not repeated. Differences between the display panel 42 of FIG. 19 and the display panel 30 of FIG. 13 are as follows. In the display panel 42 of FIG. 19, in the unit region U1 of the unit region row L1, the third sub-pixel C is located on the first sub-column (i.e. the sub-column C1) and is located on the first sub-row and the second sub-row (i.e. the sub-row R1 and the sub-row R2), the second sub-pixel B is located on the second sub-column (i.e. the sub-column C2) and is located on the second sub-row (i.e. the sub-row R2), the fourth sub-pixel D is located on the third sub-column (i.e. the sub-column C3) and is located on the first sub-row and the second sub-row (i.e. the sub-row R1 and the sub-row R2), and the first sub-pixel A is located on the second sub-column (i.e. the sub-column C2) and is located on the first sub-row (i.e. the sub-row R1). And in the unit region U2 of the unit region row L2, the third sub-pixel C is located on the first sub-column (i.e. the sub-column C2) and is located on the first sub-row and the second sub-row (i.e. the sub-row R3 and the sub-row R4), the second sub-pixel B is located on the second sub-column (i.e. the sub-column C3) and is located on the second sub-row (i.e. the sub-row R4), the fourth sub-pixel D is located on the third sub-column (i.e. the sub-column C4) and is located on the first sub-row and the second sub-row (i.e. the sub-row R3 and the sub-row R4), and the first sub-pixel A is located on the second sub-column (i.e. the sub-column C3) and is located on the first sub-row (i.e. the sub-row R3).

In other words, in the embodiment of FIG. 19, the shapes of the third sub-pixel C and the fourth sub-pixel D are rectangles, and the shapes of the first sub-pixel A and the second sub-pixel B are squares, and the first sub-pixel A and the second sub-pixel B are located between the third sub-pixel C and the fourth sub-pixel D and are arranged along the second direction D2.

According to another aspect, referring to FIG. 3 and FIG. 19, in the present embodiment, the shapes of the first sub-pixel A and the second sub-pixel B using the same light-emitting material 151 and capable of emitting two color lights (i.e. the first color light IA and the second color light IB) with the main peak difference therebetween within 50 nm are all squares, and the first sub-pixel A and the second sub-pixel B respectively belong to different pixels, where the third sub-pixel C and the second sub-pixel B construct a pixel (i.e. the first pixel P1), and the fourth sub-pixel D and the first sub-pixel A construct a pixel (i.e. the second pixel P2).

Further, in the embodiments of FIG. 1 to FIG. 19, in the display panel 10 to the display panel 42, the length of the micro cavity is adjusted through the thickness difference ΔH between the transparent conductive layer 124 of the first sub-pixel A and the transparent conductive layer 124 of the second sub-pixel B, such that the light-emitting material 151 contained in the light-emitting layer 150 of the first sub-pixel A and contained in the light-emitting layer 150 of the second sub-pixel B can emit the first color light IA and the second color light IB having the main peak difference therebetween within 50 nm. However, the invention is not limited thereto. In other embodiments, the required technical effect can be achieved by adjusting a thickness of the hole transport layer. A display panel of the other embodiment of the invention is described below with reference of FIG. 20. It should be noticed that only the differences between the various embodiments are described below, and the parts with the same technical contents are not repeated.

Figure 20:
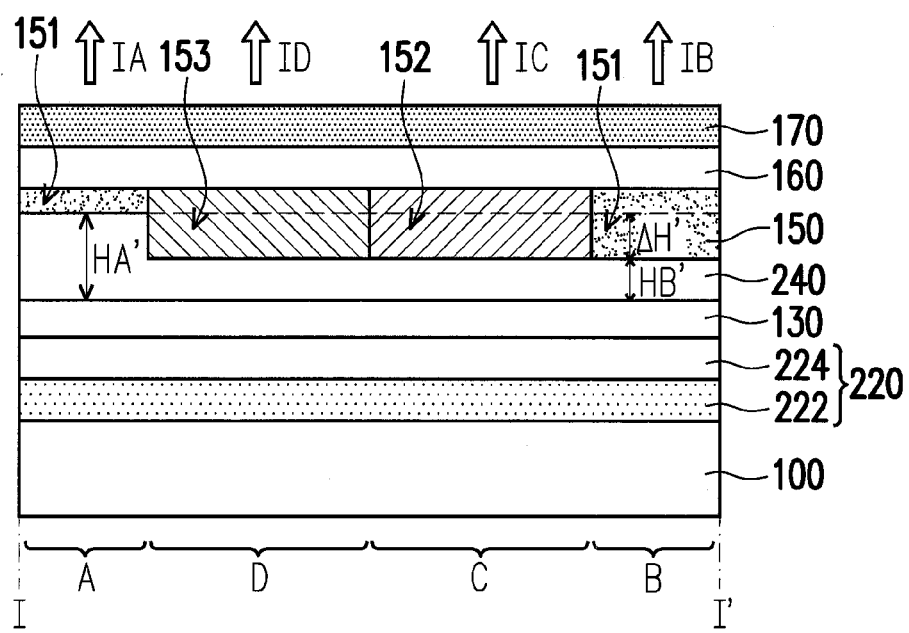
FIG. 20 is a cross-sectional view of a display panel along a section line I-I' according to another embodiment of the invention.

FIG. 20 is a cross-sectional view of a display panel along a section line I-I' according to another embodiment of the invention. The top view of the display panel 44 of FIG. 20 is as that shown in FIG. 1, where a cross-section position of FIG. 20 may refer to the position of the section line I-I' in FIG. 1. Moreover, the embodiment of FIG. 20 is similar to the embodiment of FIG. 3, so that the same or similar components are denoted by the same or similar symbols, and descriptions thereof are not repeated.

Referring to FIG. 20 and FIG. 3, differences between the display panel 44 of FIG. 20 and the display panel 10 of FIG. 3 are as follows. In the display panel 44 of FIG. 20, the first electrode layer 220 including the reflective conductor layer 222 and the transparent conductive layer 224 has substantially the same thickness in the first sub-pixel A, the second sub-pixel B, the third sub-pixel C and the fourth sub-pixel D, and a thickness HA' of a hole transport layer 240 of the first sub-pixel A is different to a thickness HB' of the hole transport layer 240 of the second sub-pixel B. In detail, the thickness HA' of the hole transport layer 240 of the first sub-pixel A is greater than the thickness HB' of the hole transport layer 240 of the second sub-pixel B, and the thickness difference ΔH' between the hole transport layer 240 of the first sub-pixel A and the hole transport layer 240 of the second sub-pixel B is between 20 nm and 50 nm. In an example, the thickness difference ΔH' between the hole transport layer 240 of the first sub-pixel A and the hole transport layer 240 of the second sub-pixel B is preferably between 25 nm and 35 nm.

In other words, in the embodiment of FIG. 20, in the display panel 44, the length of the micro cavity is mainly adjusted through the thickness difference ΔH' between the hole transport layer 240 of the first sub-pixel A and the hole transport layer 240 of the second sub-pixel B, such that the light-emitting material 151 contained in the light-emitting layer 150 of the first sub-pixel A and contained in the light-emitting layer 150 of the second sub-pixel B can emit the first color light IA and the second color light IB having the main peak difference therebetween within 50 nm. In this way, in the present embodiment, by using the same light-emitting material 151 in the light-emitting layer 150 of the first sub-pixel A and the light-emitting layer 150 of the second sub-pixel B, and making the thickness difference ΔH' between the hole transport layer 240 of the first sub-pixel A and the hole transport layer 240 of the second sub-pixel B to be between 20 nm and 50 nm, not only the display panel 40 can emit four color lights (i.e. the first color light IA, the second color light IB, the third color light IC and the fourth color light ID), but also the number of times of using the fine metal mask during fabrication of the light-emitting layer 150 is decreased, so as to decrease a production cost of the display panel 10 and simplify a fabrication process thereof.

Moreover, although design and arrangement of the sub-pixels in the display panel 44 are implemented according to the embodiment of FIG. 1, those skilled in the art should understand that design and arrangement of the sub-pixels in the display panel 44 can also be implemented according to the embodiments of FIG. 4 to FIG. 19.

In summary, in the display panel of the present invention, since each pixel is composed of two sub-pixels, the display panel of the invention may achieve effects of reduced pixel area and improved resolution. Moreover, in the display panel of the invention, the same light-emitting material contained in the light-emitting layer of the first sub-pixel and contained in the light-emitting layer of the second sub-pixel is capable of emitting two color lights with a main peak difference therebetween within 50 nm. In this way, not only the display panel is capable of emitting lights of four colors, but also a production cost of the display panel is decreased, and a fabrication process thereof is simplified.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A display panel, comprising:
a substrate, comprising a plurality of unit regions, wherein the unit regions are arranged along a first direction and a second direction; and
a plurality of first sub-pixels, a plurality of second sub-pixels, a plurality of third sub-pixels and a plurality of fourth sub-pixels, disposed on the substrate, wherein each of the unit regions is configured with one first sub-pixel, one second sub-pixel, one third sub-pixel and one fourth sub-pixel, and each of the first sub-pixels, each of the second sub-pixels, each of the third sub-pixels and each of the fourth sub-pixels respectively comprise:
a first electrode layer;
a light-emitting layer, disposed on the first electrode layer; and
a second electrode layer, disposed on the light-emitting layer,
wherein the light-emitting layer of each of the first sub-pixels and the light-emitting layer of each of the second sub-pixels comprise a same light-emitting material, wherein the light-emitting material is capable of emitting a first color light and a second color light, and a difference between a main peak of the first color light and a main peak of the second color light is within 50 nm in a wavelength range, wherein the first electrode layer comprises a reflective conductor layer and a transparent conductive layer disposed on the reflective conductor layer, and a thickness difference between the transparent conductive layer of each of the first sub-pixels and the transparent conductive layer of each of the second sub-pixels ranges from 20 nm to 50 nm.

2. The display panel as claimed in claim 1, wherein
the light-emitting material is a yellow light-emitting material, the first color light is a yellow light, and the second color light is a green light; or
the light-emitting material is a red light-emitting material, the first color light is a red light, and the second color light is an orange light; or
the light-emitting material is a green light-emitting material, the first color light is a green light, and the second color light is a cyan light.

3. The display panel as claimed in claim 1, wherein any two of the first sub-pixel, the second sub-pixel, the third sub-pixel and the fourth sub-pixel in each of the unit regions respectively have two opposite long sides, and two opposite short sides, wherein an extending direction of the two long sides is parallel to the second direction, and the other two of the first sub-pixel, the second sub-pixel, the third sub-pixel and the fourth sub-pixel are located between the any two sub-pixels and are arranged along the second direction.

4. The display panel as claimed in claim 3, wherein the other two sub-pixels respectively have two opposite long sides and two opposite short sides, wherein an extending direction of the two long sides is parallel to the first direction.

5. The display panel as claimed in claim 3, wherein the any two sub-pixels are the first sub-pixel and the second sub-pixel, wherein the first sub-pixel and the third sub-pixel in each of the unit regions construct a first pixel, the second sub-pixel and the fourth sub-pixel in each of the unit regions construct a second pixel, and the first pixel and the second pixel respectively have an L-shape.

6. The display panel as claimed in claim 3, wherein the any two sub-pixels are the first sub-pixel and the fourth sub-pixel, wherein the first sub-pixel and the second sub-pixel in each of the unit regions construct a first pixel, the third sub-pixel and the fourth sub-pixel in each of the unit regions construct a second pixel, and the first pixel and the second pixel respectively have an L-shape.

7. The display panel as claimed in claim 3, wherein the any two sub-pixels are the first sub-pixel and the fourth sub-pixel, wherein the first sub-pixel and the third sub-pixel in each of the unit regions construct a first pixel, the second sub-pixel and the fourth sub-pixel in each of the unit regions construct a second pixel, and the first pixel and the second pixel respectively have an L-shape.

8. The display panel as claimed in claim 1, wherein the unit regions are arranged in delta arrangement.

9. The display panel as claimed in claim 1, wherein the unit regions are arranged into a plurality of unit region rows along the first direction, and any of the unit region row is arranged in dislocation with a next unit region row.

10. The display panel as claimed in claim 9, wherein the first sub-pixel, the second sub-pixel, the third sub-pixel and the fourth sub-pixel in each of the unit regions respectively have two opposite long sides and two opposite short sides, an extending directions of the two long sides of the first sub-pixel and the second sub-pixel are parallel to the second direction, extending directions of the two long sides of the third sub-pixel and the fourth sub-pixel are parallel to the first direction, the third sub-pixel and the fourth sub-pixel are located between the first sub-pixel and the second sub-pixel and are arranged along the second direction, and the first sub-pixel, the second sub-pixel, the third sub-pixel and the fourth sub-pixel in each of the unit regions define two rows of a first sub-row and a second sub-row and four columns of a first sub-column, a second sub-column, a third sub-column and a fourth sub-column, wherein in each of the unit regions, the first sub-pixel is located on the first sub-column and is located on the first sub-row and the second sub-row, the third sub-pixel is located on the second sub-column and the third sub-column and is located on the second sub-row, the second sub-pixel is located on the fourth sub-column and is located on the first sub-row and the second sub-row, and the fourth sub-pixel is located on the second sub-column and the third sub-column and is located on the first sub-row; and the first sub-column of a unit region on the second unit region row is aligned to the second sub-column, the third sub-column or the fourth sub-column of a unit region on the first unit region row.

11. The display panel as claimed in claim 9, wherein the first sub-pixel, the second sub-pixel, the third sub-pixel and the fourth sub-pixel in each of the unit regions respectively have two opposite long sides and two opposite short sides, extending directions of the two long sides of the first sub-pixel and the fourth sub-pixel are parallel to the second direction, extending directions of the two long sides of the second sub-pixel and the third sub-pixel are parallel to the first direction, the second sub-pixel and the third sub-pixel are located between the first sub-pixel and the fourth sub-pixel and are arranged along the second direction, and the first sub-pixel, the second sub-pixel, the third sub-pixel and the fourth sub-pixel in each of the unit regions define two rows of a first sub-row and a second sub-row and four columns of a first sub-column, a second sub-column, a third sub-column and a fourth sub-column, wherein in each of the unit regions, the first sub-pixel is located on the first sub-column and is located on the first sub-row and the second sub-row, the second sub-pixel is located on the second sub-column and the third sub-column and is located on the second sub-row, the fourth sub-pixel is located on the fourth sub-column and is located on the first sub-row and the second sub-row, and the third sub-pixel is located on the second sub-column and the third sub-column and is located on the first sub-row; and the first sub-column of a unit region on the second unit region row is aligned to the second sub-column, the third sub-column or the fourth sub-column of a unit region on the first unit region row.

12. The display panel as claimed in claim 9, wherein the first sub-pixel and the second sub-pixel in each of the unit regions respectively have two opposite long sides and two opposite short sides, extending directions of the two long sides of the first sub-pixel and the second sub-pixel are parallel to the second direction, the third sub-pixel and the fourth sub-pixel are located between the first sub-pixel and the second sub-pixel and are arranged along the second direction, and the first sub-pixel, the second sub-pixel, the third sub-pixel and the fourth sub-pixel in each of the unit regions define two rows of a first sub-row and a second sub-row and three columns of a first sub-column, a second sub-column and a third sub-column, wherein in each of the unit regions, the first sub-pixel is located on the first sub-column and is located on the first sub-row and the second sub-row, the third sub-pixel is located on the second sub-column and is located on the second sub-row, the second sub-pixel is located on the third sub-column and is located on the first sub-row and the second sub-row, and the fourth sub-pixel is located on the second sub-column and is located on the first sub-row; and the first sub-column of a unit region on the second unit region row is aligned to the second sub-column or the third sub-column of a unit region on the first unit region row.

13. The display panel as claimed in claim 9, wherein the first sub-pixel and the fourth sub-pixel in each of the unit regions respectively have two opposite long sides and two opposite short sides, extending directions of the two long sides of the first sub-pixel and the fourth sub-pixel are parallel to the second direction, the second sub-pixel and the third sub-pixel are located between the first sub-pixel and the fourth sub-pixel and are arranged along the second direction, and the first sub-pixel, the second sub-pixel, the third sub-pixel and the fourth sub-pixel in each of the unit regions define two rows of a first sub-row and a second sub-row and three columns of a first sub-column, a second sub-column and a third sub-column, wherein in each of the unit regions, the first sub-pixel is located on the first sub-column and is located on the first sub-row and the second sub-row, the second sub-pixel is located on the second sub-column and is located on the second sub-row, the fourth sub-pixel is located on the third sub-column and is located on the first sub-row and the second sub-row, and the third sub-pixel is located on the second sub-column and is located on the first sub-row; and the first sub-column of a unit region on the second unit region row is aligned to the second sub-column or the third sub-column of a unit region on the first unit region row.

14. A display panel, comprising:
a substrate, comprising a plurality of unit regions, wherein the unit regions are arranged along a first direction and a second direction; and
a plurality of first sub-pixels, a plurality of second sub-pixels, a plurality of third sub-pixels and a plurality of fourth sub-pixels, disposed on the substrate, wherein each of the unit regions is configured with one first sub-pixel, one second sub-pixel, one third sub-pixel and one fourth sub-pixel, and each of the first sub-pixels, each of the second sub-pixels, each of the third sub-pixels and each of the fourth sub-pixels respectively comprise:

a first electrode layer;

a light-emitting layer, disposed on the first electrode layer; and a second electrode layer, disposed on the light-emitting layer, wherein the light-emitting layer of each of the first sub-pixels and the light-emitting layer of each of the second sub-pixels comprise a same light-emitting material, wherein the light-emitting material is capable of emitting a first color light and a second color light, and a difference between a main peak of the first color light and a main peak of the second color light is within 50 nm in a wavelength range, wherein each of the first sub-pixels, each of the second sub-pixels, each of the third sub-pixels and each of the fourth sub-pixels respectively comprise a hole transport layer disposed on the first electrode layer, wherein a thickness difference between the hole transport layer of each of the first sub-pixels and the hole transport layer of each of the second sub-pixels ranges from 20 nm to 50 nm.

* * * * *